United States Patent
Wessels et al.

(10) Patent No.: US 8,691,392 B2
(45) Date of Patent: Apr. 8, 2014

(54) JUNCTIONS COMPRISING MOLECULAR BILAYERS FOR THE USE IN ELECTRONIC DEVICES

(75) Inventors: Jurina Wessels, Starnberg (DE); Florian Von Wrochem, Stuttgart (DE); Bjoern Luessem, Dresden (DE); Deqing Gao, Stuttgart (DE); Heinz-Georg Nothofer, Duesseldorf (DE); William E. Ford, Stuttgart (DE)

(73) Assignee: Sony Corporation, Tokyo (JP)

( * ) Notice: Subject to any disclaimer, the term of this patent is extended or adjusted under 35 U.S.C. 154(b) by 334 days.

(21) Appl. No.: 12/988,093

(22) PCT Filed: Apr. 22, 2009

(86) PCT No.: PCT/EP2009/002933
§ 371 (c)(1),
(2), (4) Date: Jan. 3, 2011

(87) PCT Pub. No.: WO2009/130017
PCT Pub. Date: Oct. 29, 2009

(65) Prior Publication Data
US 2011/0108793 A1   May 12, 2011

(30) Foreign Application Priority Data

Apr. 22, 2008  (EP) .................................... 08007772

(51) Int. Cl.
*H01L 29/40*  (2006.01)
*H01L 21/04*  (2006.01)

(52) U.S. Cl.
USPC ................. 428/457; 257/4; 438/99; 156/182

(58) Field of Classification Search
None
See application file for complete search history.

(56) References Cited

U.S. PATENT DOCUMENTS

| 5,211,762 | A | 5/1993 | Isoda et al. | |
|---|---|---|---|---|
| 8,022,394 | B2 * | 9/2011 | Solomon et al. | 257/25 |
| 2003/0175154 | A1 | 9/2003 | Hsu et al. | |
| 2005/0008321 | A1 | 1/2005 | Zhang et al. | |
| 2006/0001020 | A1 * | 1/2006 | Zhang et al. | 257/40 |

FOREIGN PATENT DOCUMENTS

EP   0 390 523   10/1990

OTHER PUBLICATIONS

Reichert et al, Driving Current through Single Organic Molecules, Physical Review Letters, vol. 88, No. 17, Apr. 2002.*
Reed et al, Conductance of a Molecular Junction, Science, vol. 278, Oct. 1997, pp. 252-253.*
International Search Report issued Jun. 19, 2009 in PCT/EP09/002933 filed Apr. 22, 2009.

* cited by examiner

*Primary Examiner* — Monique Jackson
(74) *Attorney, Agent, or Firm* — Oblon, Spivak, McClelland, Maier & Neustadt, L.L.P.

(57) ABSTRACT

The present invention relates to asymmetric molecular bilayers for the use in the junctions of electronic devices, such as crossbar junctions, comprising the general structure $E_T$-$M_T()M_B$-$E_B$, wherein $E_T$ and $E_B$ denote a top and a bottom electrode, $M_T$ and $M_B$ represent functional molecules both forming a self-assembled monolayer (SAM) on said top or bottom electrode, and the symbol ( ) denotes a non-covalent interaction between the two monolayers, resulting in a molecular bilayer, sandwiched between the two electrodes. The electrodes are solid state electrodes and stationary with respect to each other. The present invention also relates to a method of producing such assemblies.

17 Claims, 6 Drawing Sheets

JUNCTIONS COMPRISING MOLECULAR BILAYERS FOR THE USE IN ELECTRONIC DEVICES

The present invention relates to asymmetric molecular bilayers for the use in the junctions of electronic devices, such as crossbar junctions, comprising the general structure $E_T$-$M_T$( )$M_B$-$E_B$, wherein $E_T$ and $E_B$ denote a top and a bottom electrode, $M_T$ and $M_B$ represent functional molecules both forming a self-assembled monolayer (SAM) on said top or bottom electrode, and the symbol ( ) denotes a non-covalent interaction between the two monolayers, resulting in a molecular bilayer, sandwiched between the two electrodes. The electrodes are solid state electrodes and stationary with respect to each other. The present invention also relates to a method of producing such assemblies.

Molecular electronics is concerned with a set of electronic behaviors in molecule-containing structures that are dependent upon the characteristic molecular organization [M. A. Ratner (2002) *Materials Today*, February issue, pp. 20-27]. The realization of molecular electronics during the past two decades was brought about by the development of self-assembly methodologies and scanning probe technologies, both to prepare molecular nanostructures and to characterize their physical and electrical properties. Current research is using molecules in such electronic applications as interconnects, switches, rectifiers, transistors, nonlinear components, dielectrics, photovoltaics, and memories [J. R. Heath, M. A. Ratner (2003) *Physics Today*, May issue, pp. 43-49]. One of the most attractive architectures for designing molecular electronic circuits for computational applications and interfacing them to the macroscopic world is the crossbar. A molecular crossbar device typically comprises two orthogonal arrays of parallel electrodes (or "wires") with molecules between the crossed electrodes [T. Hoag, G. Snider (2006) *IEEE Trans. Nanotechnology* 5, 97-100; T. Hogg, Y. Chen, P. Kuekes (2006) *IEEE Trans. Nanotechnology* 5, 110-122]. The region where two electrodes cross is called a junction or crosspoint. Depending on the nature of the molecular layer and the electrodes, each junction may be configured to provide functions such as memory or logic. To date, the junctions in molecular crossbar devices have mainly comprised molecular monolayers and tunneling barriers sandwiched between crossed metal lines. In practice, the crossbar molecular device can be connected to larger-scale external circuits (fabricated using conventional lithography) to provide I/O to the molecular devices. In addition, demultiplexer circuits are being considered for connecting crossbar circuits with larger conventional circuits and to manage random variations in connection locations and electrical characteristics of the junctions.

Electrons in organic molecules generally belong to one of the three classes: σ-electrons, π-electrons, and n-electrons (nonbonding electrons). In chemical terms, a single bond between atoms, such as C—C, C—H, and C—N contains only σ-electrons, a multiple bond such as C=C, C≡C, and C=N contains π-electrons in addition to σ-electrons, while atoms to the right of carbon in the periodic table such as N, O, and F contain n-electrons. Electronically excited states are produced by the absorption of infrared (700-1000 nm), visible (400-700 nm), near ultraviolet (200-400 nm), or far ultraviolet (100-200 nm) light. The absorption of a photon induces an electronic transition in which an electron originally present in a molecular orbital, usually a bonding or nonbonding molecular orbital of the ground state, is promoted to a higher-lying molecular orbital. Most organic molecules exist as ground-state singlets, in which all electrons are paired, referred to as the $S_0$ state. Absorption of a single photon by a molecule normally promotes a single electron, so the excited state produced is characterized by two singly occupied orbitals. Spin restrictions forbid electron spin inversion during the electronic transition, so the excited state produced by photoexcitation is also a singlet, and singlet-singlet electronic transitions are the only ones easily observed spectroscopically. The excited states are described by molecular orbitals that are unoccupied in the ground state and are commonly called antibonding orbitals. The antibonding orbital associated with the σ bond is referred to as the σ* orbital and that associated with the π bond is the π* orbital. An electronic transition from a π molecular orbital to a π*-orbital, referred to as a π→π* transition, occurs in unsaturated compounds such as alkenes, alkynes, and aromatic molecules. A transition from a nonbonding orbital to a π*-orbital, or n→π* transition, is of lower energy than the corresponding π→π* transition because nonbonding molecular orbitals lie at higher energy than the π-bonding ones. Absorption maxima due to σ→σ* transitions occur in the far ultraviolet region. Methane and ethane, for example, have maxima at 122 nm and 135 nm, respectively. Absorption maxima due to the π→π* transitions of isolated multiple bonds within organic molecules also typically occur in the far ultraviolet region, such as C=C (170 nm), C≡C (170 nm), C=O (166 nm), and C=N (190 nm). Thus the energy of the lowest singlet excited state ($S_1$) due to a σ→σ* or π→π* transition in a non-conjugated organic molecule or group is greater than approximately 6 eV. The highest wavelength absorption maximum reflects a transition from the lowest energy vibrational level in the ground state of a molecule to the lowest energy vibrational level of the excited state and provides a good experimental estimate of the HOMO-LUMO energy gap.

The electron donor/acceptor properties of molecules in the gas phase are characterized by the ionization potential (IP) and electron affinity (EA), which are standard outputs from molecular orbital calculations (HOMO and LUMO energies). However the values of IP and EA are not directly applicable to liquid or solid phases where interactions with the medium, especially the solvation of ions, become important. IP and EA are known to correlate with electrochemical oxidation ($E^0_{ox}$) and reduction ($E^0_{red}$) potentials in solution. From the energy balance of electrode equations and neglecting entropy factors, two simple relationships can be derived:

$$E^0_{ox} = IP - (\Delta G^0)_{solv}^+ \text{ and}$$

$$E^0_{red} = EA + (\Delta G^0)_{solv}^-,$$

wherein $E^0_{ox}$ and $E^0_{red}$ are the absolute electrode potentials (referenced to the vacuum level) and $(\Delta G^0)_{solv}^\pm$ is the difference in free energies of solvation of the neutral molecule and its ion (cation or anion). The absolute electrode potential of the normal hydrogen electrode ($E^0_{NHE}$) is −4.5 V. Ruoff et al. (1995) [R. S. Ruoff, K. M. Kadish, P. Boulas, E. C. M. Chen (1995) *J. Phys. Chem.* 99, 8843-8850] found that the value of $-(\Delta G^0)_{solv}^-$ is constant for compounds with similar charge delocalization: 1.76±0.06 eV for fullerenes (highly delocalized), 1.99±0.05 eV for aromatic hydrocarbons (delocalized), 2.19±0.14 eV for metal acetylacetonate complexes, and 2.5±0.1 eV for nitro-substituted aromatic hydrocarbons (localized). The values of IP and EA of molecules are further related to the electronegativity (EN) by the relation: EN=(IP+EA)/2; EN for aromatic hydrocarbons is nearly constant: −4.1±0.2 eV [E. S. Chen, E. C. M. Chen, N. Sane, L. Talley, N. Kozanecki, S. Shulze (1999) *J. Chem. Phys.* 110, 9319-9329]. Some of these relationships are diagrammed in FIG. 1, where anthracene is used as representative of a conjugated (π)

group (subunit). Also shown in this figure are the Fermi energy levels ($E_F$) of aluminum and gold.

The simplest function of a molecular electronic device is that of a two-terminal rectifier (or diode). Two basic concepts have been proposed for such devices, both of which comprise a single molecule spanning two electrodes. The first concept for a molecular rectifier was proposed by Aviram and Ratner in 1974 [A. Aviram, M. A. Ratner (1974) *Chem. Phys. Lett.* 29, 277-283] (see FIG. 2). This rectifier has two conjugated groups of atoms, one being electron-rich (electron donor, D) and the other being electron-poor (electron acceptor, A), connected by a non-conjugated group of atoms (sometimes referred to as a bridge, or insulator, or tunnel barrier). The molecules used in this type of molecular rectifier can be symbolized as $CON_1$-$\pi_1$-$\sigma$-$\pi_2$-$CON_2$, where the symbol "$\pi$" denotes a conjugated group, the symbol "$\sigma$" denotes a non-conjugated group, and the symbol "—" denotes a chemical bond connecting the groups; $CON_1$ and $CON_2$ denote connecting groups that bind to the two electrodes to facilitate electron transport across the electrode-molecule interface. The second basic concept for a molecular rectifier was proposed by Kornilovitch et al. in 2002 [P. E. Kornilovitch, A. M. Bratkovsky, R. S. Williams (2002) *Phys. Rev. B* 66, 165436-165436]. This rectifier has one conjugated group of atoms separated from the electrodes by non-conjugated groups with different lengths, and can be symbolized as $CON_1$-$\sigma_1$-$\pi$-$\sigma_2$-$CON_2$. The mechanisms by which these two kinds of molecular rectifiers operate were described in the original manuscripts. In both cases, the $\pi$ subunits provide energy levels (HOMO and/or LUMO) whose positions can be raised or lowered via the applied bias to become resonant with a Fermi level of an electrode, and the $\sigma$ subunits function as tunnel barriers (their HOMO and LUMO levels are energetically inaccessible). An investigation of intramolecular charge transfer in solution between TE systems separated by rigid hydrocarbon spacers with varied degrees of unsaturation led Paulson et al. (2005) to conclude that the transfer of charge (electrons or holes) occurs by two independent processes: superexchange, which is dominant when $\Delta G^0$ is large (>0.3 eV), and hopping, which is dominant when $\Delta G^0$ is small (<0.3 eV) [B. P. Paulson, J. R. Miller, W.-X. Gan, G. Closs (2005) *J. Am. Chem. Soc.* 127, 4860-4868].

Numerous molecular electronic systems have been described in the prior art. These systems are based on the two concepts for rectifiers mentioned above as well as other concepts. Most of them comprise junctions with single molecules. This approach has two main disadvantages, both of which are related to the use of a single monolayer between the electrodes.

One disadvantage of the prior art arises from the fact that the molecules need to be oriented in the same direction within the layer. Unidirectionality can be achieved by using molecules that have electrode-binding groups at one end and not at the other end, but such devices will suffer from poor electrical and physical contact between the molecules and the top electrode. Unidirectionality can also be achieved by using molecules that have electrode-binding groups at both ends, but the binding groups at one end need to be protected during deposition on the bottom electrode and then deprotected before deposition of the top electrode, making the synthesis and fabrication steps more complicated.

A second disadvantage of the prior art arises from the fact that self-assembled monolayers always contain structural defects, including defects known as (molecular) pinholes. Such defects can lead to electrically shorted junctions due to migration of metal atoms from the electrode into the monolayer under applied bias.

TABLE 1

Prior art bilayer systems.

1 CON subunit:

[1] Au | $\sigma_1$ | $\pi_D$ | $\pi_A$ | $\sigma_2$ | CON | Hg

2 CON subunits:

[2] Hg | CON | $\sigma_1$ | $\sigma_2$ | CON | Hg

[3] Au | CON | $\sigma_1$ | $\sigma_2$ | CON | Hg

[4] Au | CON | $\sigma_1$ | $\sigma_2$ | CON | Au

[5] Ag | CON | $\pi$ | $\sigma$ | CON | Hg

TABLE 1-continued

Prior art bilayer systems.

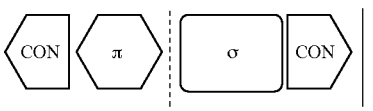

[1] Ho et al. (1990 Chem. Eur. J. I 1, 2914-2922.
[2] Slowinski et at (1999) J. Am. Chem. Soc. 121, 7257-7261.
[3] Galperin et al. (2003)J. Electroanal. Chem. 550-551 337-350.
[4] Vilan and Hikmet (2008) J. Phys. Chem. C 112, 269-281.
[5] Grave et al. (2004) Syn. Met. 147, 1 1-18.
[6] Grave et al. (2007) Adr.Funct. Mater. 17, 3816-3828.
[7] Ashwell et al. (2004) J.Mater. Chem. 14, 2389-2394.
[8] Wassel et al. (2004) J. Am. Chem. Soc. 126, 295-300.
[9] Ashwell et al. (2003)J. Mater. Chem. 13, 1501-1503.
[10] Ashwell et al. (2004) J. Am. Chem. Soc. 126, 7102-7110.

Most relevant to the present invention are systems involving self-assembled bilayers. Table 1 provides a summary of such prior art systems, wherein the symbols "σ" and "π" denote non-conjugated and conjugated groups, respectively, while "D" and "A" denote π groups that are electron-rich and electron-poor, respectively. CON represents the group connecting the molecules to the electrodes.

As can be seen in Table 1, several prior art systems have a bilayer arrangement that is formed by two monolayers that are completely non-conjugated (σ-only), i.e. the two monolayers contain no conjugated (π) groups and are insulating (see [2] to [4]). The other bimolecular systems of the prior art use either liquid state electrodes made of mercury (Hg) (see [1] to [6]) or arrangements comprising one fixed and one mobile electrode (STM tip) for use in scanning tunnel microscopy (STM) (see [7] to [10]). None of these systems is suitable for junctions, such as crossbar junctions, for use in molecular electronic devices.

It was an object of the present invention to provide for junctions, such as crossbar junctions, for use in molecular electronic devices having improved defect tolerance, better stability, greater versatility, as well as simpler requirements for synthesis and fabrication.

The objects of the present invention are solved by a junction comprising a bilayer of two different functional molecules $M_B$ and $M_T$, sandwiched between a bottom electrode ($E_B$) and a top electrode ($E_T$), wherein at least one of said functional molecules $M_B$ and $M_T$ contains a conjugated (π) system;

said electrodes $E_B$ and $E_T$ are solid state electrodes and stationary with respect to each other; and said junction is formed by depositing a self-assembled monolayer of said functional molecule $M_B$ on said electrode $E_B$, depositing a self-assembled monolayer of said functional molecule $M_T$ on said electrode $E_T$, and bringing said two self-assembled monolayers in contact with each other.

In one embodiment of the present invention said junction is a crossbar junction.

In a preferred embodiment said bottom electrode and said top electrode are made of a material, for each electrode being independently selected from a metal and/or a semiconductor, said metal being preferably selected from the group comprising the transition metals, Mg, Ca, Zn, Cd, Al, Ga, In, and Sn as well as alloys thereof, and said semiconductor being preferably selected from the group comprising C, Si, Ge, and metal compounds, preferably compounds of transition metals, selected from Zn, Cd, Al, Ga, In, and Sn, with elements from the periodic table groups 15 (N-family) and 16 (O-family).

In one embodiment the material for said bottom electrode and the material for said top electrode are the same or different.

In one embodiment said first functional molecule ($M_B$) and said second functional molecule ($M_T$) have the general structure:

CON—ROD, wherein the segment denoted CON— is a connecting group bound to said bottom electrode ($E_B$) or said top electrode ($E_T$), and the segment denoted —ROD comprises a non-conjugated ($\sigma$) group, a conjugated ($\pi$) group, or a combination of one or more non-conjugated group(s) ($\sigma$) and one or more conjugated group(s) ($\pi$).

In a preferred embodiment said connecting group CON— of CON—ROD is selected from the group comprising $S_2$CNH— or $S_2$CNR— (dithiocarbamate, −1 charge), S— (thiolate, −1 charge), Se— (selenate, −1 charge), Te— (tellurate, −1 charge), S(SR)— (disulfide, 0 charge), $S_2$C— (dithiocarboxylate, −1 charge), $S_2$C=C(CN)— (ethylenedithiolate, −2 charge); $S_2$C=C(CN)C(O)O— (ethylenedithiolate, −2 charge); $S_2$C=C[C(O)—]$_2$ (ethylenedithiolate, −2 charge), $S_2C_2$R— (1,2-dithiolate, −2 charge), $S_2$CO— (xanthate, −1 charge), $S_3$P— (trithiophosphonate, −2 charge), $S_2$PR— (phosphinodithioate, −1 charge), $S_2$P(OR)— or $S_2$P(R)O— (phosphonodithioate, −1 charge), $S_2$P(OR)O— (phosphorodithioate, −1 charge), SOC— (thiocarboxylate, −1 charge), SC(NH$_2$)NH— or SC(NHR)NH— (thiourea, 0 charge), SC$_4$H$_3$— (thiophene, 0 charge), S(R)— (thioether, 0 charge), CN— (isonitrile, 0 charge), NC$_5$H$_4$— (pyridine, 0 charge), P(R)(R')— (phosphine, 0 charge), O$_2$C— (carboxylate, —1 charge), O$_2$P(O)—(phosphonate, −2 charge), O$_2$P(O)O— (phosphate, −2 charge), OS(O)$_2$— (sulfonate, −1 charge), OS(O)$_2$O— (sulfate, −1 charge), wherein R and R' denote alkyl, aryl, or alkaryl substituents, and wherein the term "X charge", with "X" being −2, −1, or 0, denotes the electrical charge of the corresponding molecule.

2,2-Disubstituted 1,1-ethyl enedithiolate di anions having the general formula $[S_2C=C(X)(Y)]_2^-$, are obtained by reacting active methylene compounds with $CS_2$ in the presence of a base. Thus, for example, the addition of $CS_2$ to a solution of 4-bromophenylacetonitrile and 1,8-diazabicyclo[5.4.0]undec-7-ene in tetrahydrofuran yields the 1,1-ethylenedithiolate salt wherein X=CN and Y=4-bromophenyl; likewise the use of 4-bromophenylcyanoacetate instead of 4-bromophenylacetonitrile yields the salt wherein Y=4-bromophenylcarboxy [S. Huertas, M. Hissler, J. E. McGarrah, R. J. Lachicotte, R. Eisenberg (2001) *Inorg. Chem.* 40, 1183-1188]. A 1,2-dithiolene is an unsaturated bidentate ligand, wherein the two donor atoms are sulfur.

It is recognized that distinction between CON— and —ROD segments of CON—ROD may be ambiguous due to the sharing of an atom or bond between the segments. In particular, in the combination $S_2$CN<, wherein the N-atom is a heteroatom in a ring system, such as piperazine or piperidine, the CON— group can be represented most simply as $S_2$C— (dithiocarboxylate) connected to the N-atom of the ring, whereas CON— is chemically better described as dithiocarbamate. One can refer to the groups generally as dithiolate groups.

In one embodiment said non-conjugated group(s) ($\sigma$) of the segment —ROD of CON—ROD are selected from the group of straight alkane chains, cyclic or polycyclic aliphatic carbon skeletons, having the general structure:

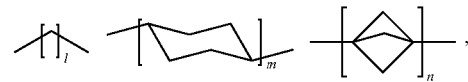

wherein "l" is selected from integers between and including 1 to 18, preferably between and including 1 to 8, "m" is selected from integers 1 and 2, and "n" is selected from integers between and including 1 to 3, and further derivatives thereof, wherein one or more of the CH$_2$ groups is substituted by NH, O, or S.

In a preferred embodiment of the invention the combined length of said non-conjugated group(s) (a) of the segment —ROD of CON—ROD is less than 3 nm.

In one embodiment of the present invention said functional molecule (CON—ROD) has the general structure CON-$\sigma$,
CON-$\pi$,
CON-$\pi_D$,
CON-$\pi_A$,
CON-$\sigma$-$\pi$,
CON-$\sigma$-$\pi_D$,
CON-$\sigma$-$\pi_A$,
CON-$\pi$-$\sigma$,
CON-$\pi_D$-$\sigma$,
CON-$\pi_A$-$\sigma$,
CON-$\sigma$-$\pi$-$\sigma$,
CON-$\sigma$-$\pi_D$-$\sigma$,
CON-$\sigma$-$\pi_A$-$\sigma$,
CON-$\pi_D$-$\sigma$-$\pi_A$,
CON-$\pi_A$-$\sigma$-$\pi_D$,
CON-$\sigma$-$\pi$-$\sigma$-$\pi_A$,
CON-$\sigma$-$\pi_D$-$\sigma$-$\pi_A$,
CON-$\sigma$-$\pi_A$-$\sigma$-$\pi_D$,
CON-$\pi_D$-$\sigma$-$\pi_A$-$\sigma$,
CON-$\pi_A$-$\sigma$-$\pi_D$-$\sigma$,
CON-$\sigma$-$\pi$-$\sigma$-$\pi_A$-$\sigma$,
CON-$\sigma$-$\pi_D$-$\sigma$-$\pi_A$-$\sigma$, or
CON-$\sigma$-$\pi_A$-$\sigma$-$\pi_D$-$\sigma$, wherein $\sigma$ denotes a non-conjugated group, $\pi$ denotes a conjugated group, $\pi_A$ denotes a conjugated group with electron acceptor character, and $\pi_D$ denotes a group with electron donor character.

In one embodiment said non-conjugated groups ($\sigma$) are selected from the group comprising aliphatic and alicyclic systems and heteroatom substituted derivatives thereof, and said conjugated groups ($\pi$) are selected from the group comprising aromatic, heterocyclic, and organometallic systems.

In one embodiment, said non-conjugated groups ($\sigma$) and said conjugated groups ($\pi$) are joined covalently by linkages selected from the group comprising a C—C bond, a C=C bond, a C≡C bond, an amine (C—N) bond, an ether (C—O) bond, an ester (C(O)—O) bond, an amide (C(O)—N) bond, an imine (C=N) bond, an oxime (C=N—O) bond, a hydrazone (C=N—N) bond, an azo (N=N) bond, an azoxy (N=N(O)) bond, an azine (C=N—N=C) bond, and an imide (C—N(C(O))$_2$) bond.

In one embodiment said functional molecule having the general structure CON-$\sigma$ is selected from the group comprising

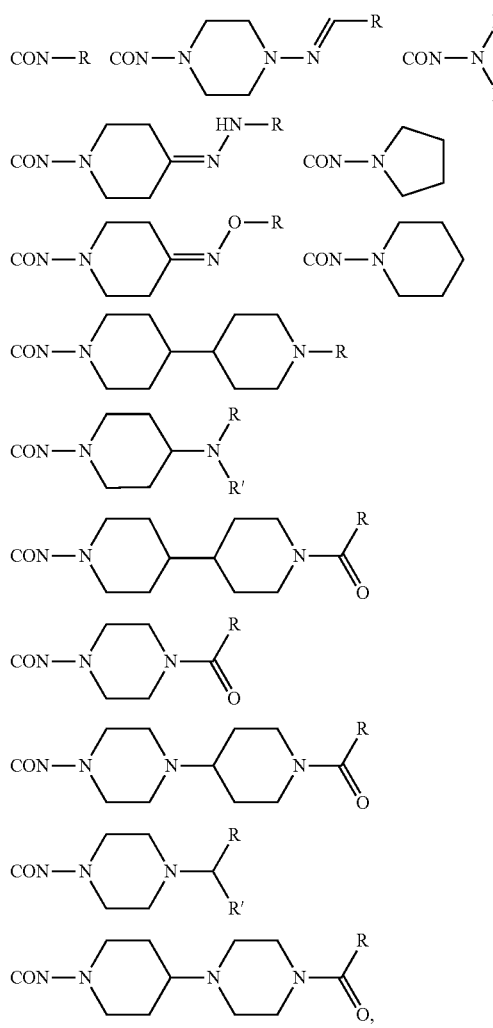

wherein R and R' denote aliphatic or alicyclic substituents.

In one embodiment said functional molecule having the general structure CON-π is selected from the group comprising

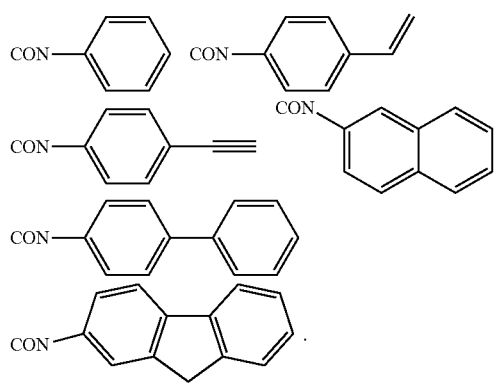

In one embodiment said functional molecule having the general structure CON-$\pi_D$ is selected from the group comprising

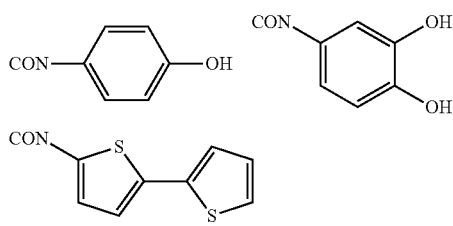

In one embodiment said functional molecule having the general structure CON-$\pi_A$ is selected from the group comprising

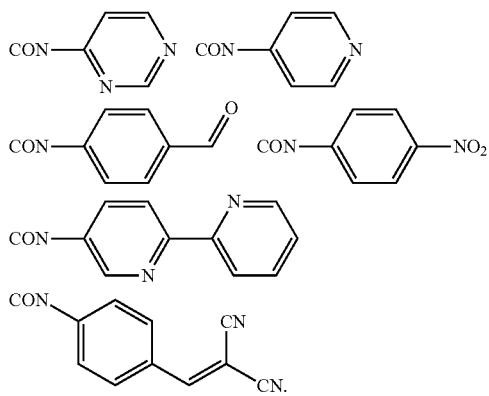

In one embodiment said functional molecule having the general structure CON-σ-π is selected from the group comprising

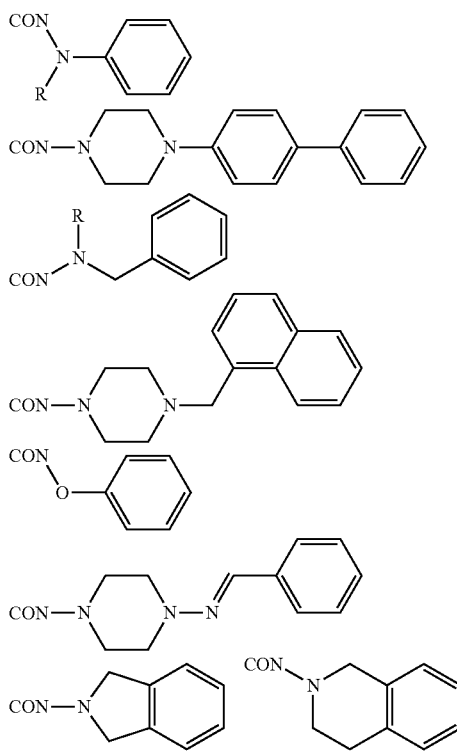

-continued

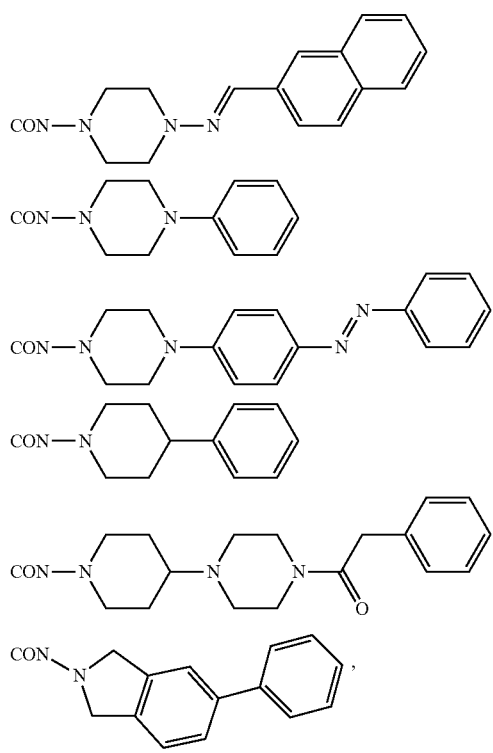

wherein R denotes an aliphatic or alicyclic substituent.

In one embodiment said functional molecule having the general structure CON-σ-$\pi_D$ is selected from the group comprising

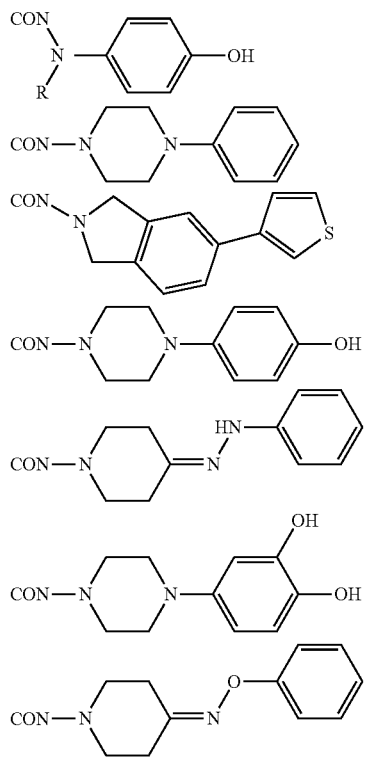

-continued

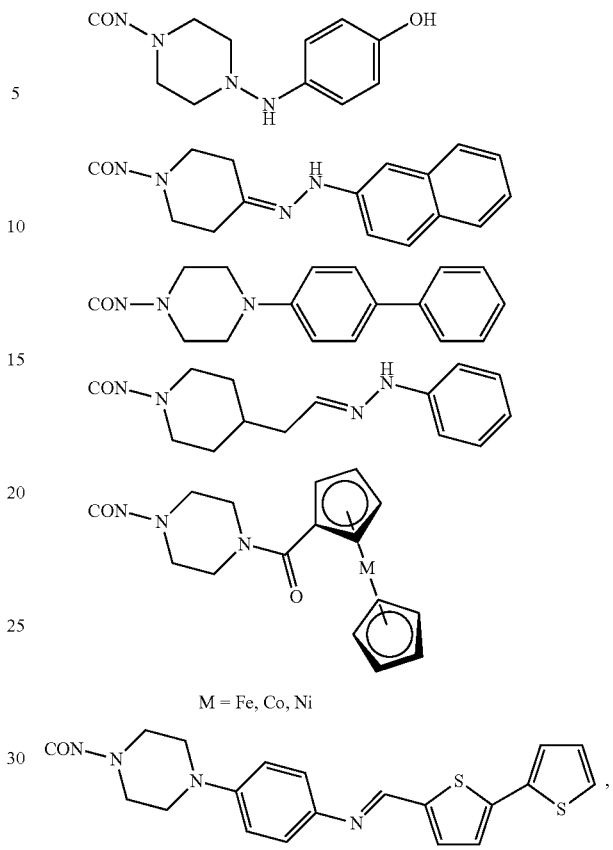

M = Fe, Co, Ni wherein R denotes an aliphatic or alicyclic substituent.

In one embodiment said functional molecule having the general structure CON-σ-$\pi_A$ is selected from the group comprising

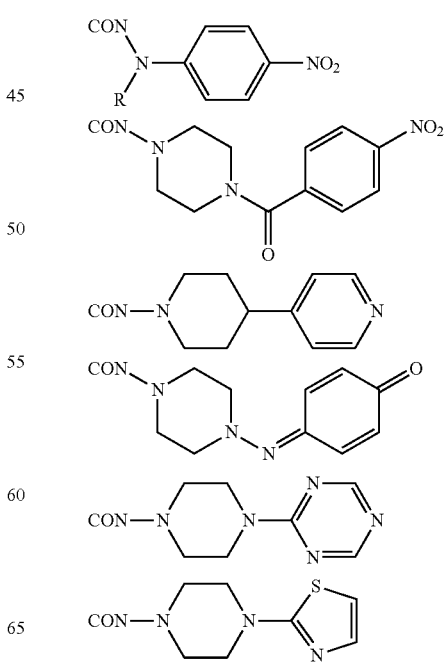

-continued

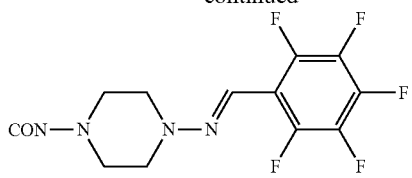
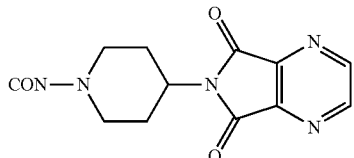
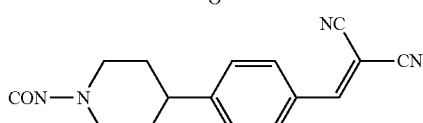
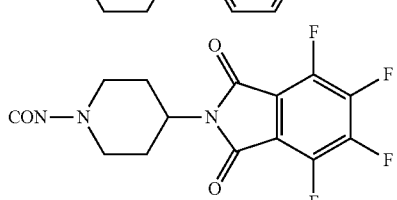
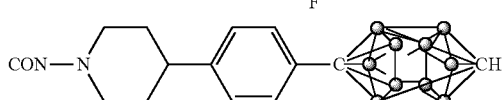
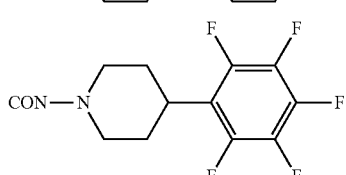
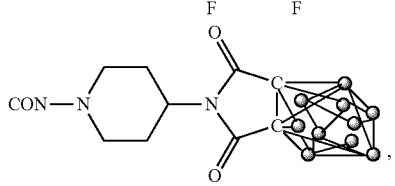

● = BH wherein R denotes an aliphatic or alicyclic substituent.

In one embodiment said functional molecule having the general structure CON-π-σ is selected from the group comprising

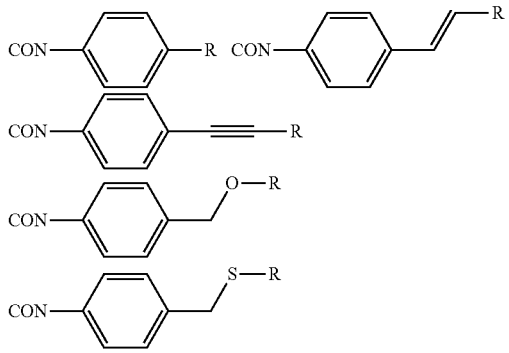

-continued

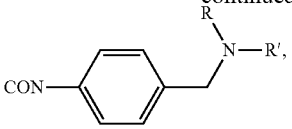

wherein R and R' denote aliphatic or alicyclic substituents.

In one embodiment said functional molecule having the general structure CON-$\pi_D$-σ is selected from the group comprising

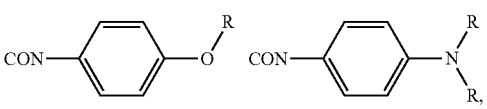

wherein R denotes an aliphatic or alicyclic substituent.

In one embodiment said functional molecule having the general structure CON-$\pi_A$-σ is selected from the group comprising

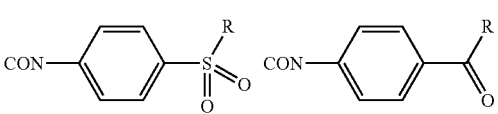
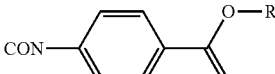
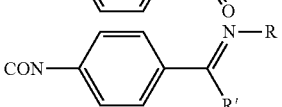
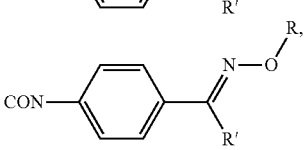

wherein R and R' denote aliphatic or alicyclic substituents.

In one embodiment said functional molecule having the general structure CON-σ-π-σ is selected from the group comprising

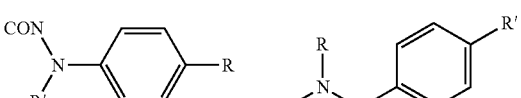
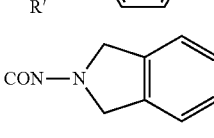
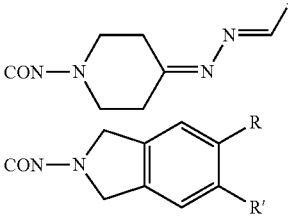

15

-continued

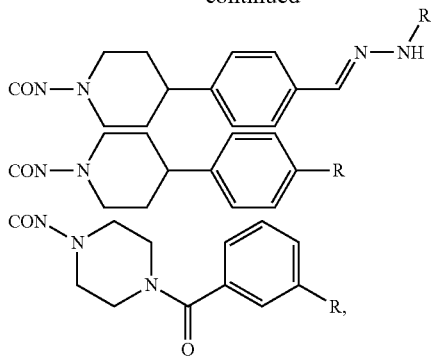

wherein R and R' denote aliphatic or alicyclic substituents.

In one embodiment said functional molecule having the general structure CON-σ-$\pi_D$-σ is selected from the group comprising

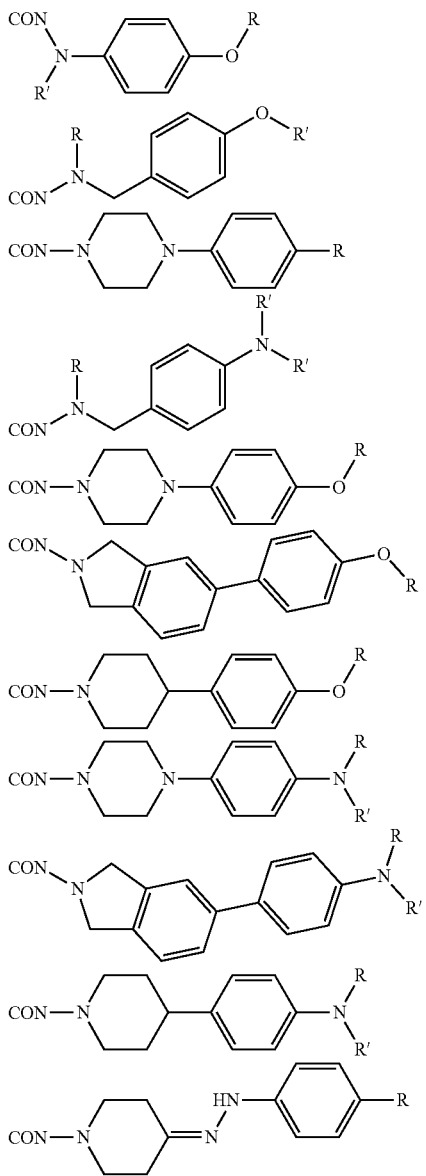

16

-continued

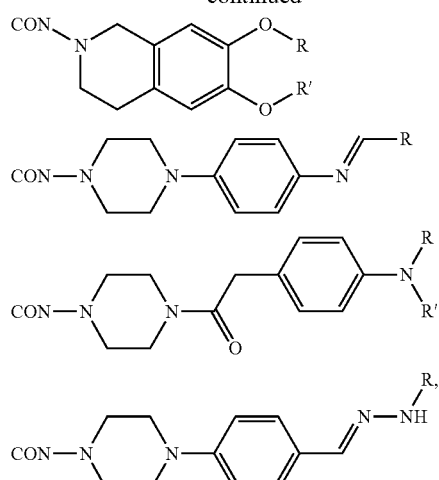

wherein R and R' denote aliphatic or alicyclic substituents.

In one embodiment said functional molecule having the general structure CON-σ-$\pi_A$-σ is selected from the group comprising

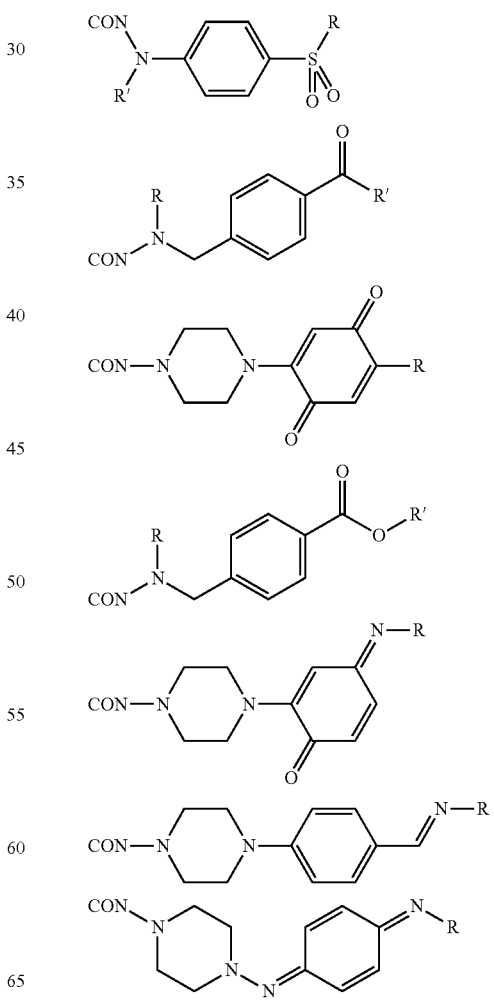

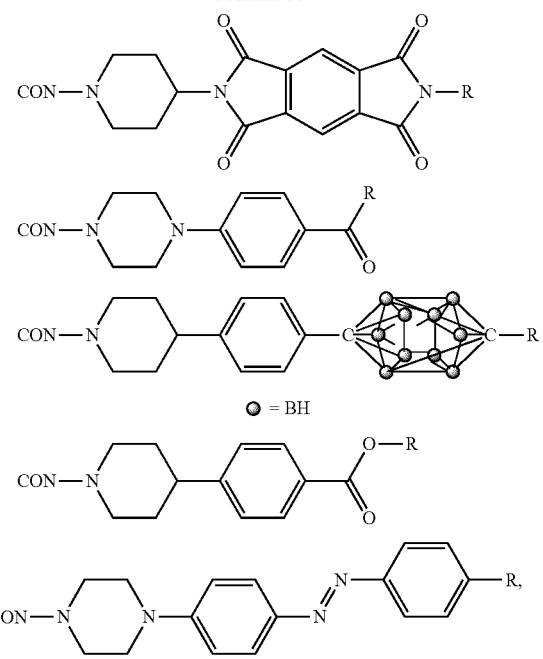

wherein R denotes an aliphatic or alicyclic substituent.

In one embodiment said functional molecule having the general structure CON-$\pi_D$-$\sigma$-$\pi_A$ is selected from the group comprising

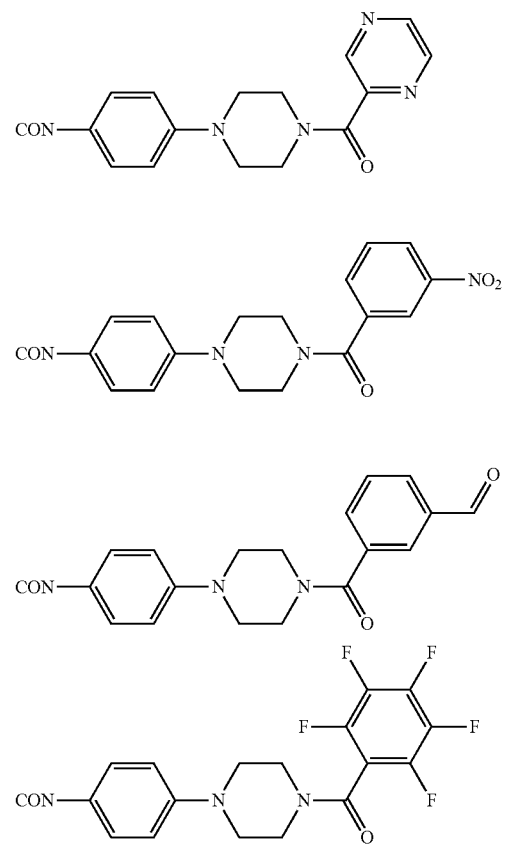

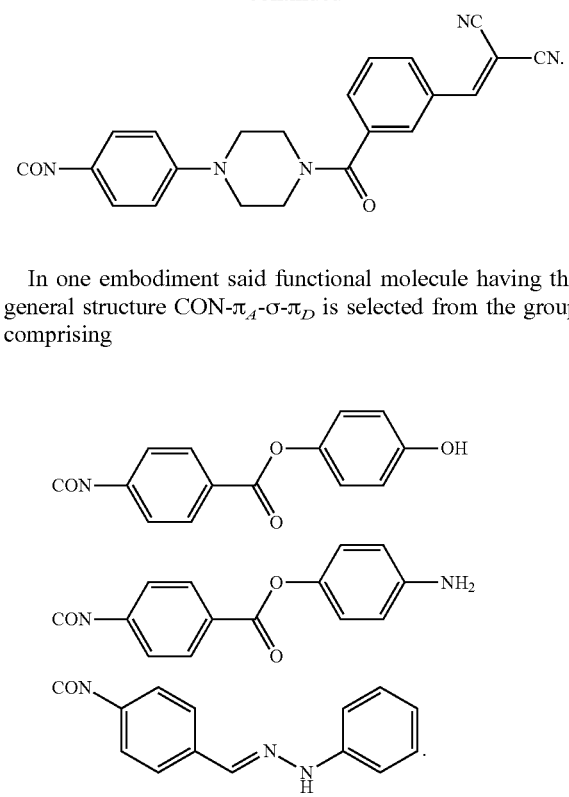

In one embodiment said functional molecule having the general structure CON-$\pi_A$-$\sigma$-$\pi_D$ is selected from the group comprising In one embodiment said functional molecule having the general structure CON-$\sigma$-$\pi_D$-$\sigma$-$\pi_A$ is selected from the group comprising

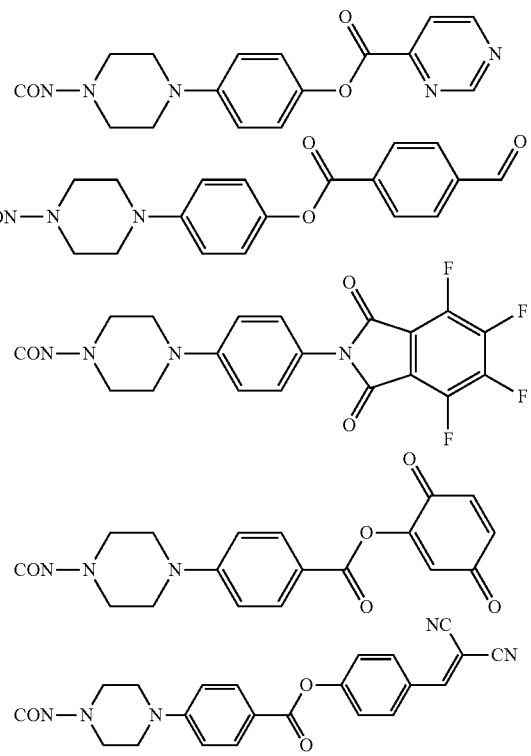

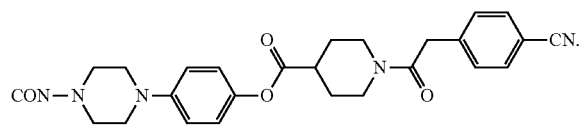

In one embodiment said functional molecule having the general structure CON-σ-$\pi_A$-σ-$\pi_D$ is selected from the group comprising

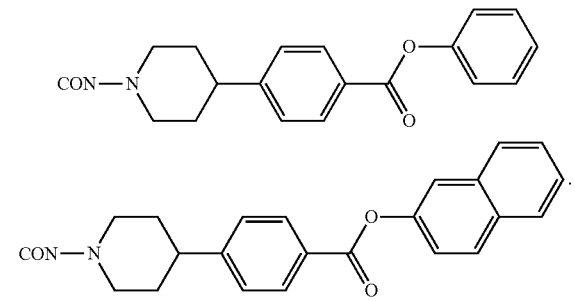

In one embodiment said functional molecule having the general structure CON-σ-$\pi_D$-σ-$\pi_A$-σ is selected from the group comprising

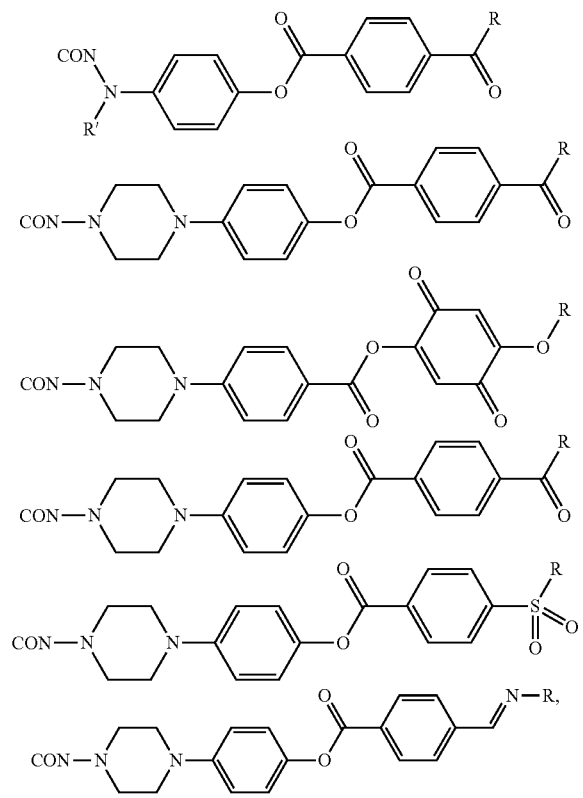

wherein R denotes an aliphatic or alicyclic substituent.

In one embodiment said functional molecule having the general structure CON-σ-$\pi_A$-σ-$\pi_D$-σ is selected from the group comprising

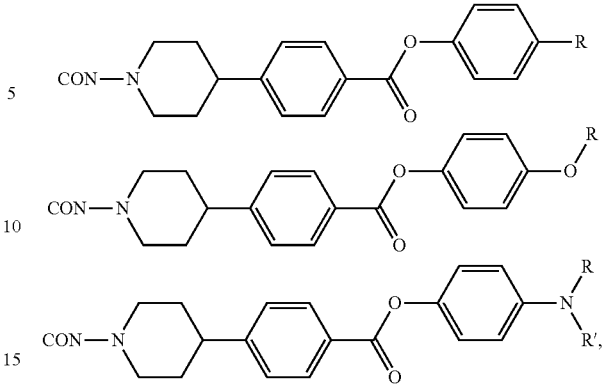

wherein R and R' denote aliphatic or alicyclic substituents.

In one embodiment said functional molecule is selected from the group comprising piperazine derivatives, piperidine derivatives, as well as combinations thereof.

In a preferred embodiment of the present invention combinations of said functional molecules $M_B$ and $M_T$ forming said molecular bilayer are selected from the group comprising CON-π and CON-σ,
CON-π-σ and CON-σ,
CON-σ-π and CON-σ,
CON-σ-π-σ and CON-σ,
CON-$\pi_D$ and CON-σ-$\pi_A$-σ,
CON-$\pi_A$ and CON-σ-$\pi_D$-σ,
CON-$\pi_D$-σ-$\pi_A$ and CON-σ,
CON-$\pi_A$-σ-$\pi_D$ and CON-σ,
CON-$\pi_D$-σ and CON-σ-$\pi_A$-σ,
CON-$\pi_A$-σ and CON-σ-$\pi_D$-σ,
CON-$\pi_D$-σ-$\pi_A$-σ and CON-σ,
CON-$\pi_A$-σ-$\pi_D$-σ and CON-σ,
CON-σ-$\pi_D$ and CON-σ-$\pi_A$-σ,
CON-σ-$\pi_A$ and CON-σ-$\pi_D$-σ,
CON-σ-$\pi_D$-σ-$\pi_A$ and CON-σ,
CON-σ-$\pi_A$-σ-$\pi_D$ and CON-σ,
CON-σ-$\pi_D$-σ-$\pi_A$-σ and CON-σ, and
CON-σ-$\pi_A$-σ-$\pi_D$-σ and CON-σ.

When selecting appropriate pairs of $\pi_D$ and $\pi_A$ subunits within the molecules $M_T$ and/or $M_B$ comprising bilayer assemblies with the donor-a-acceptor architecture, it is recognized that the relative energies of the frontier orbitals (HOMO and LUMO) of the subunits may be more important than the absolute energies. A π-conjugated subunit that functions as donor ($\pi_D$) in one $M_T$( )$M_B$ combination in a junction may function as acceptor ($\pi_A$) in another junction, depending on the electronic properties of the π-conjugated subunit with which it is paired. Thus, a subunit with weakly electron donating or accepting character could function as $\pi_D$ when paired with a relatively strongly accepting $\pi_A$ subunit, or it could function as $\pi_A$ when paired with a relatively strongly donating $\pi_D$ subunit. The electron donating or accepting character of a π-conjugated system such as an aromatic ring is determined in part by its substituents. Replacement of one or more hydrogen atoms of a benzene ring by halogen atoms (F, Cl, Br, I) or by substituents containing halogen atoms, such as $CF_3$ or $COCF_3$, or by substituents containing double or triple bonds, such as CHO, $COCH_3$, CN, or $NO_2$, tends to decrease the chemical potential of the benzene ring, thereby making it a stronger $\pi_A$ group. Such "electron poor" ("electron withdrawing") substituents have positive Hammett substituent constants [C. Hansch, A. Leo, R. W. Taft (1991) *Chem. Rev.* 91, 165-195]. Likewise, replacement of one or more of the CH groups in a benzene ring by N atoms, such as in pyridine or pyrazine, makes the conjugated system a stronger electron acceptor. Conversely, replacement of one or more H atoms by "electron rich" ("electron donating") substituents such as $CH_3$, $OCH_3$, or $N(CH_3)_2$ groups tends to increase the chemical potential of the benzene ring, thereby making it a stronger $\pi_D$ group. Such electron rich substituents have negative Hammett constants. The relative electron-donating or accepting strengths of π-conjugated subunits can only be estimated qualitatively on the basis of the Hammett constants of the substituents, however, and experimental or theoretical determinations are necessary for more quantitative predictions.

Polyhedral carboranes (or carbaboranes), such as the icosahedral closo-carboranes, are σ-aromatic cage compounds having one or more carbon atoms in a borane cluster framework. They have been described as three-dimensional aromatic systems, by analogy with the two-dimensional benzene ring. However, unlike aromatic hydrocarbons, carboranes contain neither lone-pair electrons nor π electrons. Instead, carboranes contain tangentially delocalized σ-bonding (i.e., σ-aromaticity) so that their HOMO-LUMO gaps are far greater than the HOMO-LUMO gaps in π-aromatic systems. Various organic chemical strategies have been developed to selectively introduce substituents or functional groups onto the carbon and/or boron atoms. 1,12-Dicarba-closo-dodecaborane, in particular, has been used as a structural and/or electronic element in rigid-rod and liquid crystalline compounds. Treatment of the icosahedral anion $CB_{11}H_{12}^-$ with excess chlorine or bromine leads to regiospecific hexahalogenation of the cage, forming the corresponding 7,8,9,10,11,12-$CB_{11}H_6X_6^-$ (X=Cl or Br) derivatives [T. Jelinek, J. Pleek, S. Hemanek, B. St'ibr (1986) *Collect. Czech. Chem. Commun.* 51, 819-829]. Such halogenation reactions are expected to decrease the chemical potential of the carborane cage, thereby making it a stronger electron acceptor. Although carborane cages cannot be considered as π-conjugated subunits, they are included in the present invention in view of their favourable chemical and electronic properties.

The objects of the present invention are also solved by a method of producing the junction as defined above using a non-invasive deposition technique, preferably selected from the group comprising lift-off float-on (LOFO), nanotransfer printing (nTP), polymer-assisted lift-off (PALO) or shuttle-transfer printing (STP).

In a preferred embodiment polymer-assisted lift-off (PALO) is used, comprising the steps:

a) providing a first substrate having a surface, b) coating said surface with a layer of water-soluble material, c) applying a layer of metal and/or semiconductor material on said layer of water-soluble material, d) creating a resist pattern on said layer of metal and/or semiconductor material, e) removing said layer of metal and/or semiconductor material in positions which are not covered by said resist pattern by means of an etching technique, f) removing said resist pattern to leave behind a pattern of metal and/or semiconductor material (top electrode, $E_T$) on said layer of water-soluble material.

g) covering said pattern of metal and/or semiconductor material ($E_T$) and said layer of water soluble material by a polymeric layer, h) covering said polymeric layer with a reinforcing polymeric layer, i) immersing said first substrate and the various layers on it, resulting from steps b)-h), in a bulk of water or in a bulk of aqueous solution until said layer of water soluble-material is dissolved, such that an assembly consisting of said reinforcing polymeric layer, said polymeric layer, and said pattern of metal and/or semiconductor material is detached from said first substrate, j) immersing said assembly consisting of said reinforcing polymeric layer, said polymeric layer, and said pattern of metal and/or semiconductor material in a bulk of an aqueous solution of the functional molecule ($M_T$) or precursors thereof or exposing it to a vapour of the functional molecule ($M_T$), resulting in a self-assembled monolayer of said functional molecule ($M_T$) on said pattern of metal and/or semiconductor material ($E_T$), k) providing a second substrate having a surface and a pattern of metal and/or semiconductor material (bottom electrode, $E_B$) on said surface, l) immersing said second substrate with said pattern of metal and/or semiconductor material ($E_B$) in a bulk of a solution of the functional molecule ($M_B$) or precursors thereof or exposing it to a vapour of the functional molecule ($M_B$), resulting in a self-assembled monolayer of said functional molecule ($M_B$) on said pattern of metal and/or semiconductor material ($E_B$), m) combining the assembly of step j) comprising the self-assembled monolayer of said functional molecule ($M_T$) on said pattern of metal and/or semiconductor material ($E_T$) and said second substrate with said pattern of metal and/or semiconductor material ($E_B$) and the self-assembled monolayer of said functional molecule ($M_B$) deposited thereon, thereby forming a junction comprising said bottom electrode ($E_B$) and said top electrode ($E_T$), further comprising said molecular bilayer sandwiched between said bottom electrode ($E_B$) and said top electrode ($E_T$), said molecular bilayer being formed by the non-covalent interaction of said self-assembled monolayer of said first functional molecule ($M_B$) deposited on said bottom electrode ($E_B$) and said self-assembled monolayer of said second functional molecule ($M_T$) deposited on said top electrode ($E_T$). [Note: the use of an aqueous bath for floating the top electrodes and then "fishing" it out with the bottom electrode is just one way to assemble the top and bottom parts; since the top electrodes have the reinforcing layer, the top and bottom parts can also be assembled using an "aligner" such as a FINEPLACER® system (Finetech GmbH)]

In one embodiment said first and said second substrate are made of silicon.

In one embodiment said water soluble material is made of polyacrylic acid.

In one embodiment said etching technique is argon plasma etching.

In one embodiment said polymeric layer is made of polymethylmethacrylate (PMMA).

In one embodiment said reinforcing polymeric layer is made of an epoxy based photoresist, such as SU8®, or a silicon-based organic polymer, such as polydimethylsiloxane (PDMS).

The objects of the present invention are also solved by the use of a junction as characterized above for the production of an electronic device, a photonic device, or an electro-optical device.

The term "junction" is meant in the context of the present invention to refer to the region where two electrodes intersect. In its simplest form, a "junction" in a molecular device comprises a single molecule sandwiched between two electrodes. More generally, the junction comprises an assembly of molecules rather than a single one. A molecular junction device comprises an array of such junctions formed by pairs of crossed electrodes ("wires") where one electrode crosses another at a non-zero angle, typically ninety degrees (="crossbar junction"). The "wires" in junction or crossbar devices are typically metal lines that are tens of nanometers to several micrometers in width. Depending on the nature of the molecular layer and the electrodes, each junction may be configured to provide functions, such as memory or logic.

The term "self-assembly" is meant to refer to a process by which individual molecules spontaneously form a defined aggregate.

The term "self-assembled monolayer" (or "SAM") as used herein is meant to refer to a two-dimensional film, which is one molecule thick and is covalently organized or assembled at an interface. Typically, this ordered molecular assembly is formed by the adsorption of molecules on a solid surface [A. Ulman (1996) Chem. Rev. 96, 1533-1554]. The adsorption can occur chemically (=chemisorption) or physically (=physisorption). Chemisorption refers to the formation of a chemical bond between adsorbate and substrate involving a substantial rearrangement of electron density. The nature of this bond may lie anywhere between the extremes of virtually complete ionic or complete covalent character. Physisorption refers to the interaction of adsorbate and substrate which is exclusively based on weak van der Waals—type forces. There is no significant redistribution of electron density in either the molecule or at the substrate surface. Although not limited to functionalized long-chain molecules, this class of compounds is most frequently used for SAM formation. Examples of SAMs include monolayers of fatty acids on aluminum oxide or silver, monolayers of organosilicon derivatives on silicon oxide or aluminum oxide, alkyl monolayers on silicon, and monolayers of organosulfur compounds on metal or semiconductor surfaces. Of these examples, the latter, particularly SAMs of thiol compounds on gold surfaces, have received the most attention for use in molecular electronic devices. Nuzzo and Allara [R. G. Nuzzo, D. L. Allara (1983) J. Am. Chem. Soc. 105, 4481-4483] were the first to show that dialkyl disulfides form SAMs on gold.

It should be noted that, in accordance with the present invention, said self-assembled monolayer of said functional molecule $M_B$ is chemically bound to said electrode $E_B$, and said self-assembled monolayer of said functional molecule $M_T$ is chemically bound to said electrode $E_T$. Such chemical binding is herein also sometimes referred to as "chemisorption", and the respective monolayers are sometimes also referred to as being "chemisorbed" to their respective electrodes. It should also be noted that such chemical binding or chemisorption allows for a better contact between the monolayer and its respective electrode. Likewise, because of such chemisorptions the process of depositing on and coupling said monolayer to the respective electrode occurs in a better and more controlled fashion.

It should also be noted that, in contrast to such chemisorption, between the monolayer and its respective electrode, the two monolayers contact each other at their interface through non-covalent interactions. The two monolayers form a "molecular bilayer".

The term "molecular bilayer" is meant in the context of the present invention to refer to a film comprising two monolayers (e.g. SAMs) of molecules facing "back-to-back", i.e. with the ends attached to the electrodes facing outward and the nonattached ends facing inward. The two layers are kept together by non-covalent interactions of the non-polar groups, i.e. dispersive or van der Waals (non-polar) and hydrogen bonding forces.

The term "non-covalent interactions" as used herein is meant to refer to a type of chemical interaction or bonding that does not involve the sharing of electrons, but rather involves more dispersed variations of electromagnetic interactions. There are four main types of non-covalent interactions: hydrogen bonding, ionic interactions, van der Waals (dipolar) interactions, and hydrophobic interactions. Non-covalent interactions often involve several of these forces working in concert. In contrast, "covalent interactions" are based on the sharing of one or more electrons, especially pairs of electrons between atoms.

The term "non-conjugated group" ($\sigma$) refers to a group of atoms being connected via single bonds, such as C—C, C—H, and C—N, or via isolated multiple bonds, e.g. a group of atoms containing only one double or triple bond or a group of atoms containing more than one double or triple bond separated from each other by two or more single bonds. The preferred non-conjugated groups ($\sigma$) in $M_B$ and $M_T$ include aliphatic and alicyclic systems and their heteroatom substituted derivatives. Referring to FIG. 1, the preferred energy of the $\sigma \rightarrow \sigma^*$ transition is >6 eV.

The term "conjugated group" ($\pi$) refers to a system of atoms covalently bonded with alternating single and multiple (e.g. double or triple) bonds (e.g., C=C—C=C—C) in an organic or organometallic molecule. This system results in a general delocalization of the electrons across all of the adjacent parallel aligned p-orbitals of the atoms, which increases stability and thereby lowers the overall energy of the molecule. The preferred conjugated groups ($\pi$) in $M_B$ and $M_T$ include aromatic, heterocyclic, and organometallic systems and the like. Referring to FIG. 1, the preferred values of $E^0_{ox}$ and $E^0_{red}$ are >2.5 eV and <5.5 eV, respectively. Conjugation is possible by other means other than the presence of alternating single and double bonds. As long as each contiguous atom in a chain possesses a pi ($\pi$) orbital, the system can be considered conjugated. For example, furan is a heterocyclic five-membered ring with two alternating double bonds and an oxygen atom. Oxygen has two lone pairs, one of which occupies the pi orbital on that position, therefore maintaining the conjugation of that five-membered ring. The presence of a nitrogen in the ring or groups alpha to the ring like a carbonyl group (C=O), an imine group (C=N), a vinyl group (C=C), or an anion will also suffice as a source of pi orbitals to maintain conjugation.

The term pi ($\pi$) electron conjugation, as currently used by chemists for carbon-based molecules, has two distinct meanings. One ("structural conjugation") carries information about molecular structure: An atom belongs to a conjugated system if its bonding environment is such that it can offer to the $\pi$-electron system a valence p orbital (or a hybrid with much p character) whose axis is more or less parallel to the axes of other such atomic orbitals that are in the system. An orbital can be offered for conjugation only if it is not already used in $\sigma$-bond formation to another atom; if it is so used, it can still be offered for hyperconjugation. The other and more common meaning of the term $\pi$-electron conjugation ("effective conjugation") refers to the effect on molecular properties offered by additional delocalization opportunities that the electron finds in an enlarged $\pi$ system: two $\pi$ systems are conjugated if the fact that they were joined into a single $\pi$ system modified those of their properties that depend on $\pi$ electrons, such as the ionization potential, electron affinity, and electronic excitation energies. If the two subsystems are connected by a bond at which structural conjugation is absent, e.g., because it is twisted, there will be no effective conjugation between them either.

The term "organic" molecule (or group) as used herein is meant to refer to a chemical compound (or group) consisting primarily of carbon and hydrogen, which may contain any number of other non-metallic or semi-metallic elements, including nitrogen, oxygen, halogens as well as phosphorus, silicon, sulfur, and boron. An "organometallic" molecule (or group) is an organic chemical compound (or group) containing a metal, especially a compound (or group) in which a metal atom is bonded directly to a carbon atom. Coordination complexes constituting a metal ion(s) and organic groups are included in this category.

As used herein, the terms "group", "segment", "subunit", "substituent", and "moiety" are intended to refer to parts of chemical compounds or molecules. Although these terms may be used interchangeably, the terms "group", "segment", and "subunit" generally refer to the CON, σ, or π parts of CON—ROD molecules, while the terms "substituent" and "moiety" generally refer to atoms or groups of atoms that are attached to said CON, σ, or π parts rather than being integral components of the CON—ROD backbone.

In organic chemistry, groups composed of carbon and hydrogen are divided into two classes: "Aromatic" groups, which include the benzene ring and other similar ring systems, and "aliphatic" groups. In aliphatic groups, carbon atoms can be joined together in straight chains, branched chains, or rings (in which case they are called "alicyclic"). They can be joined by single bonds (alkanes), double bonds (alkenes), or triple bonds (alkynes). Besides hydrogen, other elements can be bound to the carbon chain, the most common being oxygen, nitrogen, sulfur, and chlorine. The simplest aliphatic substituent is the methyl group ($-CH_3$). Alicyclic groups contain one or more all-carbon rings which may be either saturated or unsaturated, but do not have aromatic character. Alicyclic groups may or may not have aliphatic side chains attached. Simple alicyclic groups are the cyclopropyl, cyclobutyl and cyclohexyl groups.

Aromatic compounds or groups are conjugated homocyclic or heterocyclic ring systems containing (4n+2) π-electrons, with n=0, 1, 2, 3, etc. (Hückel's rule). Examples of aromatic compounds containing 6 π-electrons include 5-membered rings such as furan ($C_4H_4O$), pyrrole ($C_5H_5N$), thiophene ($C_4H_4S$), thiazole ($C_3H_3NS$) and cyclopentadienyl anion ($C_5H_5^-$) and 6-membered rings such as benzene ($C_6H_6$), pyridine ($C_5H_5N$), and pyrimidine ($C_4H_4N_2$). Examples of aromatic compounds containing 10 and 14 π-electrons are naphthalene and anthracene, respectively.

A "heteroatom" is any atom that is not carbon or hydrogen. It is typically, but not exclusively, nitrogen, oxygen, sulfur, phosphorus, boron, chlorine, bromine, or iodine.

The term "transition metal" as used herein is meant to refer to the elements in groups 3 to 11 of the Periodic Table.

The term "tunnel barrier" is meant to refer to a region in space characterized by a potential energy that is higher than the kinetic energy of an approaching electron. Due to the wavelike behavior of the electron, it has a finite probability of crossing the potential barrier. This process is called "tunneling."

The term "non-invasive deposition technique", as used herein, is meant to refer to techniques, whereby an electrode, an electrode structure or array which has been preformed is transferred physically and intact from one substrate to another before being applied to the molecular layer in the junction (in contrast to, for example, direct evaporation of the metal). In some instances, the electrode may itself have a or the molecular layer attached before being transferred.

These non-invasive deposition techniques include lift-off float-on (LOFO), nanotransfer printing (nTP), polymer-assisted lift-off (PALO), and shuttle-transfer printing (STP).

The term "reinforcing polymeric layer", which can also be referred to as "support layer", is meant to denote any layer that provides stability and rigidity to the polymeric layer, preferably polymethylmethacrylate (PMMA) layer, and the pattern of metal and/or semiconductor material. In a preferred embodiment of the present invention the "reinforcing polymeric layer" is made of an epoxy based photoresist, such as SU8®, or a silicon-based organic polymer, such as polydimethylsiloxane (PDMS).

The term "condensation reaction" as used herein is meant to refer to a chemical reaction in which two molecules combine with the loss of a smaller molecule, usually water, an alcohol, or an acid.

The term "addition reaction" is meant to refer to a chemical reaction that involves the rearrangement of electrons of the double bonds within on molecule to form single bonds in combination with another molecule. Addition reactions are essentially of two types: electrophilic and nucleophilic.

The present invention overcomes disadvantages of the prior art by employing molecular bilayers instead of monolayers in a junction, e.g. a crossbar junction. The fabrication of these molecular electronic devices involves depositing a layer of one functional molecule ($M_B$) on the bottom electrode ($E_B$), depositing a layer of a second functional molecule ($M_T$) on the top electrode ($E_T$), and then combining the two to result in a molecular electronic device comprising four stacked layers, represented by: $E_B$-$M_B$ ( ) $M_T$-$E_T$, wherein $M_B$ and $M_T$ represent self-assembled monolayers (SAMs) and the symbol "( )" denotes a non-covalent interaction between the two monolayers. The electrodes are solid state electrodes and stationary with respect to each other. Asymmetry (structural and electronic) across the junction, i.e., within $E_B$-$M_B$ ( ) $M_T$-$E_T$, is a critical feature for device function.

Each of the functional molecules $M_B$ and $M_T$ has an electrode binding group (CON) at one end only. Thus the molecules in both layers, $M_B$ and $M_T$, are unidirectionally oriented via self-assembly while also being chemically bound ("chemisorbed") to their respective electrodes. Non-covalent intermolecular interactions between the two monolayers, i.e. polar, dispersive (non-polar), and hydrogen bonding forces, are sufficient for electrical communication between the monolayers. Synthesis and fabrication steps that are required to prepare single monolayer devices with electrode binding groups at both ends of the molecules are avoided.

For the electrode binding group (CON—) in the molecules $M_B$ and $M_T$, dithiolate (also known as dithiolene) groups, such as the dithiocarbamate group ($S_2CNH$— or —$S_2CNR$), generally provide a better electrical contact (lower resistance) and higher thermal stability at the electrode-molecule interface compared to the thiolate group (S—). However, while dithiolate or other sulfur-containing groups may be preferred choices for CON— with electrodes comprising gold, silver, copper, or other metals, where oxidic surfaces can be avoided, in other situations alternative connecting groups may be better suited. For example, the carboxylate ($O_2C$—) group may be a better choice for aluminum or magnesium electrodes, which naturally develop thin (2-3 nm) oxide layers upon exposure to the ambient atmosphere. Carboxylate or other groups, such as phosphonate or sulfonate, may also be a better choice for CON— with electrodes comprising doped oxide semiconductors such as F-doped tin dioxide. The thiolate group may likewise offer advantages over dithiolate groups in certain situations.

Preferably, the molecules $M_B$ and $M_T$ have the general structure CON—ROD so that they can pack densely in the self-assembled monolayers (SAMs), thereby reducing the probability of defects, such as pinholes. The rod shape is achieved by connecting σ and π groups in a linear manner and using groups with similar cross-sectional areas. The combined length of the non-conjugated segments in $M_B$ and $M_T$ ($\Sigma d_o$) is preferably less than 3 nm and the cross-sectional areas of $M_B$ and $M_T$ are preferably in the range of 0.2 to 0.5 $nm^2$. Particularly, the piperazine and piperidine ring systems are used for several reasons: 1) their cross-sectional areas are similar to the benzene ring, 2) they provide the secondary amine functionality that is desirable as link to the connecting group (CON), 3) the aliphatic six-membered ring is semi-rigid (the relatively low degree of conformal freedom together with electronic and dipolar interactions are favorable for dense packing of piperazine and piperidine derivatives in SAMs), and 4) derivatives with a variety of useful functional groups are commercially available.

The term "rod-shaped segment" (ROD) as used herein is meant to refer to an elongated molecule. Its "rod shape" is achieved by connecting σ and π groups in a linear manner and using groups with similar cross-sectional areas. The combined length of the non-conjugated segments in $M_B$ and $M_T$ ($\Sigma d_o$) is preferably less than 3 nm and the cross-sectional areas of $M_B$ and $M_T$ are preferably in the range of 0.2 to 0.5 $nm^2$. The "rod-shaped segment" can be straight or bent. The elongated, anisotropic geometry of such rod-like molecules allows for preferential alignment along one spatial direction. According to the nomenclature proposed [P. F. H. Schwab, M. D. Levin, J. Michl Chem. Rev. 99, 1863-1933 (1999); P. F. H. Schwab, J. R. Smith, J. Michl Chem. Rev. 105, 1197-1279 (2005)] all three types of structures, axial, zig-zag, and ladder, belong to the category of "simple rods". Simple axial rods, i.e., covalent structures built from axial modules linked by single bonds or by sharing terminal atoms. Simple zig-zag rods are built formally by linking subunits. The linking is accomplished with single bonds or, in a few cases, by the sharing of terminal atoms. Unlike axial rods, whose equilibrium geometry is linear, zig-zag rods are generally not exactly linear even under the best of circumstances. The interconnecting group should cause the resulting compound to have a linear planar conformation. Linking units containing multiple bonds such as —(CH=N)—, —N=N—, —(CH=CH)$_n$—, —CH=N—N=CH—, etc. are used since they restrict the freedom of rotation.

Many liquid crystal materials are rod-like, or "calamitic," in shape. Typically, a liquid-crystalline molecule consists of a rigid moiety and one or more flexible parts. The rigid part aligns molecules in one direction, whereas the flexible parts induce fluidity in the liquid crystal. This rigid part is referred to as "mesogen," and it plays a crucial role in the molecule. The optimum balance of these two parts is essential to form liquid-crystalline materials. Organic compounds that exhibit calamitic liquid crystalline properties contain a long rigid core, often made up of several rings (aromatic, aliphatic, or heterocyclic) joined by linking groups (e.g. —CH$_2$CH$_2$—, —CH=N—, —CH$_2$O—, or —COO—), and end groups, of which one is typically a long flexible n-alkyl (or n-alkyloxy) tail and the other a polar function such as C≡N. Probably the most commonly employed core constituents are phenyl, cyclohexyl and bicyclo[2.2.2]octyl rings. Bent-core liquid crystal compounds, so-called "banana-shaped" molecules, comprise mesogenic groups that are linked through a semi-rigid group in such a way as not to be colinear.

The term "molecular cross-sectional area" as used herein is meant to refer to the average area per molecule in a monolayer and is related to the "packing density." For example, Langmuir-Blodgett films of fatty acids on water show linear plots of film pressure versus area/molecule which extrapolate to an area a zero pressure of 0.205 $nm^2$. This area is probably that of close-packed hydrocarbon chains, but it is mainly determined by the carboxyl groups of the fatty acid molecules. To obtain a well-ordered, densely packed self-assembled monolayer from a rod-shaped molecule having the general structure CON—ROD, thereby minimizing the presence of defects in the monolayer, it is desirable that none of the segments comprising the molecule (CON—, σ and/or π) are much bulkier than the others. The approximate surface areas required by the CON— groups utilized in the present invention fall in the range of 0.1 to 0.4 $nm^2$, so the molecular cross-sectional areas of $M_B$ and $M_T$ are preferably in the range of 0.2 to 0.5 $nm^2$.

Defects in SAMs occur statistically and depend on a number of factors such as the nature of the electrode (E) and molecule (M). A defect density of the order of $10^2$-$10^3$ defects per $mm^2$ can be expected based on the results of Whitesides et al. [X.-M. Zhao, J. L. Wilbur, G. M. Whitesides (1996) Langmuir 12, 3257-3264; Y. Xia, G. M. Whitesides (1998) Angew. Chem. Int. Ed. 37, 550-575]. Although such densities indicate that the probability of finding single defects in junctions comprising molecular monolayers is small, it may nevertheless be sufficient to cause devices to fail. In junctions comprising bilayers, one monolayer effectively protects the device from the presence of a defect in the other monolayer. The probability of a failure due to defects in a junction comprising a bilayer is thus significantly lower than in a junction comprising a monolayer, as illustrated in the following schematic example. We consider a defect-free, densely packed monolayer between electrodes of area A and covered with N molecules, having a maximum packing density N/A. If one or more (n) molecules are removed from this monolayer, n defects are created. Any one of these defects in the monolayer can result in the formation of a conductive filament at the defect site when an electrical bias is applied across the junction, thereby resulting in a short circuit that makes the junction inoperable. However, filament formation in a junction comprising a bilayer requires that a defect in one monolayer intersects a defect in the opposing monolayer. The probability of having two intersecting defects in a junction comprising two monolayers with n defects in each is $n^2/N^2$. Since typically n<<N, the probability of filament formation in a junction comprising a bilayer is therefore much smaller than in one comprising a monolayer.

The present invention also provides a methodology that allows for fabrication and electrical characterization of crossbar-type devices to be made without extensive organic synthetic efforts or highly specialized equipment, so that the kinds of systematic variations in molecular properties necessary for device optimization can be made relatively easily. Therefore, the present invention also has the advantage that it can serve as a flexible experimental platform for testing and optimization while also being practical in the sense that the results can be directly implemented into commercially viable devices. Although theoretical modeling and calculations can provide valuable guidance towards the design and optimization of molecular electronic devices, the methods for doing so are still being developed and refined; besides being time-consuming and expensive to obtain, the reliablity of such results is questionable. Thus, the design and optimization of molecular electronic devices depends largely on experimental results for guidance. The prior art provides a number of experimental techniques for measuring the electronic properties of molecules, but methods that measure the properties of individual molecules such as the mechanically controlled break junction and scanning tunnelling microscopy require highly specialized equipment and it is not always clear whether the results apply to assemblies of molecules such as in a crossbar junction. While the mercury drop experimental technique has some of these advantagous features, it is not clear that the results are applicable to devices with other kinds of electrodes; this distinction is important because it is unlikely that devices with mercury electrodes will ever be commercially developed.

A critical step in the fabrication of junctions comprising molecular layers is applying the top electrode. The direct evaporation of noble metals can create shorts due to the formation of filaments, while transition metals such as titanium can react chemically with the molecules. Several technologies have been developed to circumvent this problem. The mercury drop technique is versatile but not suitable for practical applications. A more practical approach is to use a thin (50-100 nm) layer of conducting polymer between the junction and the top electrode [H. B. Akkerman et al. (2006) Nature 441, 69-72; F. Milani et al. (2007) ChemPhysChem 8, 515-518]. This approach makes it possible to use direct evaporation of metal for the top electrode, but the interface between the molecular layer and polymer layer is not well defined. Other strategies to circumvent the problem involve techniques whereby the electrode is transferred from one substrate to another. These "non-invasive" or "soft contact" deposition techniques include "lift-off float-on" (LOFO) [A. Vilan and D. Cahen (2002) Adv. Funct. Mater. 12, 795-807], "nanotransfer printing" (nTP) [Y.-L. Loo et al. (2003) Nano Lett. 3, 913-917], "polymer-assisted lift-off" (PALO) [K. T. Shimizu et al. (2006) Adv. Mater. 18, 1499-1504], and "shuttle-transfer printing" (STP) [D. C. J. W. Schwaab (2007) Dissertation: "Surface patterning by means of soft lithography for molecular and bio-electronics"]. Besides being a non-destructive method to contact molecular layers, these non-invasive deposition (or soft lithographic) techniques also allow for low-cost fabrication of the devices.

While the majority of known (prior art) junctions comprising mono- or bimolecular layers utilize metals, especially relatively nonreactive metals such as gold or silver as electrode materials, junctions that utilize semiconductors as electrodes are also possible within the bilayer framework of the present invention. These semiconducting materials include carbon, silicon, and metal compounds, especially compounds of transition metals with elements from the periodic table groups 15 (N-family) and 16 (O-family).

With respect to carbon electrodes for junctions comprising molecular bilayers, for example, Ranganathan et al. [S. Ranganathan, R. McCreery, S. M. Majji, M. Madou (2000) J. Electrochem. Soc. 147, 277-282] and A. Singh et al. (2002) [A. Singh, J. Jayaram, M. Madou, S. Akbar J. Electrochem. Soc. 149, E78-E83] have described the preparation of lithographically patterned thin-film carbon electrodes on silicon or silica substrates by pyrolysis of positive or negative photoresists, respectively. Alternatively, carbon electrodes can be obtained by carbonization of carbon-rich polymeric precursors, such as copolymers of furfuryl alcohol and phenol, which are patterned using soft lithography as described by Schueller et al. [O. J. A. Schueller, S. T. Brittain, C. Marzolin, G. M. Whitesides (1997) Chem. Mater. 9, 1399-1406]. The deposition of densely packed chemisorbed molecular layers onto the surfaces of carbon electrodes by the electrochemical reduction of aryl diazonium salts has been demonstrated by Allongue et al. [P. Allongue, M. Delamar, B. Desbat, O. Fagebaume, R. Hitmi, J. Pinson, J.-M. Saveant (1997) J. Am. Chem. Soc. 119, 201-207] and by Ranganathan et al. [S. Ranganathan, I. Steidel, F. Anariba, R. L. McCreery (2001) Nano Lett. 1, 491-494]. Alternatively, Garrett et al. [D. J. Garrett, J. Lehr, G. M. Miskelly, A. J. Downard (2007) J. Am. Chem. Soc. 129, 15456-15457] showed that chemisorbed molecular layers can be deposited by microcontact printing using spontaneous reduction of aryl diazonium salts.

With respect to silicon electrodes for junctions comprising molecular bilayers, for example, Menard et al. [E. Menard, K. J. Lee, D.-Y. Khang, R. G. Nuzzo, J. A. Rogers (2004) Appl. Phys. Lett. 84, 5398-5400] have reported the fabrication single-crystal silicon ribbons from silicon-on-insulator wafers that can be deposited and patterned, by dry transfer printing or solution casting onto substrates such as plastics. Alternatively, silicon electrodes can be obtained from liquid precursors of polysilanes [T. Shimoda, Y. Matsuki, M. Furusawa, T. Aoki, I. Yudasaka, H. Tanaka, H. Iwasawa, D. Wang, M. Miyasaka, Y. Takeuchi (2006) Nature 440, 783-786]. The direct covalent grafting of conjugated molecules onto silicon surfaces from aryl diazonium salts has been demonstrated by Allongue et al. [P. Allongue, C. Henry de Villeneuve, G. Cherouvrier, R. Cortès, M.-C. Bernard (2003) J. Electroanal. Chem. 550-551, 161-174] and by Stewart et al. [M. P. Stewart, F. Maya, D. V. Kosynkin, S. M. Dirk, J. J. Stapleton, C. L. McGuiness, D. L. Allara, J. M. Tour (2004) J. Am. Chem. Soc. 126, 370-378]. Alternatively, covalent grafting of molecules onto silicon surfaces can be accomplished via silylation of the native silicon oxide layer on the silicon surface, as was employed, for example, by Lenfant et al. [S. Lenfant, C. Krzeminski, C. Delerue, G. Allan, D. Vuillaume (2003) Nano Lett. 3, 741-746] to fabricate monolayer-based molecular rectifying diodes.

The fabrication and printing of crystalline ribbons of other semiconductors besides Si, namely GaAs and InP [Y. Sun, J. A. Rogers (2004) Nano Lett. 4, 1953-1959] and GaN [K. J. Lee, J. Lee, H. Hwang, Z. J. Reitmeier, R. F. Davis, J. A. Rogers, R. G. Nuzzo (2005) Small 1, 1164-1168], is also known. Self-assembled monolayers can be deposited onto these semiconductors using, for example, aryl diazonium salts or sulfur-derivatives such as thiols or dithiocarbamates. Aryl diazonium salts have also been grafted to other electrode materials including GaAs, Pd [M. P. Stewart, F. Maya, D. V. Kosynkin, S. M. Dirk, J. J. Stapleton, C. L. McGuiness, D. L. Allara, J. M. Tour (2004) J. Am. Chem. Soc. 126, 370-378], Cu, Ni, Fe, Zn [A. Adenier, E. Cabet-Deliry, A. Chausse, S. Griveau, F. Mercier, J. Pinson, C. Vautrin-Ul (2005) Chem. Mater. 17, 491-501], Al—Cu alloys [B. L. Hurley, R. L. McCreery (2004) J. Electrochem. Soc. 151, B252-B259], Co, Pt, and indium tin oxide (ITO) [S. Maldonado, T. J. Smith, R. D. Williams, S. Morin, E. Barton, K. J. Stevenson (2006) Langmuir 22, 2884-2891].

During the formation of SAMs via aryl diazonium salts, the diazonium (—M≡, +1 charge) group is reduced and decomposes to produce $N_2$ and the aryl radical, which forms a covalent bond with an atom at the electrode surface. Thus, when ROD segments of CON—ROD are self-assembled on electrodes using the diazonium group for attachment, the CON-group can be represented by $^+N_2$-π-, where π represents the aryl group of the aryl diazonium salt, the resulting SAM comprises -π-ROD molecules, wherein the π-group is covalently bonded to an atom at the electrode surface.

As already noted, several non-invasive deposition techniques have been developed for printing top electrodes in molecular electronic devices to avoid short circuits that frequently occur when the electrodes are vapor-deposited. To a large extent, these non-invasive techniques were developed for gold as the electrode material. Although gold is extremely useful as an electrode material, its use imposes certain limitations on the nature of the CON connecting group in the molecules as well as the device performance, which depends critically on the position of the electrode's Fermi energy level ($E_F$) relative to the HOMO and/or LUMO energies of the π group(s) in the molecules (FIG. 1 and FIG. 2). To overcome these limitations, while still employing non-invasive deposition techniques known from the prior art, one of the embodiments of the present invention is to modify the surface of the gold electrode by underpotential deposition (UPD) of a layer of another metal prior to deposition of the self-assembled monolayer. UPD is an electrochemical method of depositing up to one monolayer of one kind of metal onto the surface of another kind of metal at potentials positive of values required for bulk electrodeposition. This treatment can be used for either the bottom electrode ($E_B$) or top electrode ($E_T$), or for both electrodes with the same or different UPD-deposited metals. It was shown by Jennings and Laibinis [G. K. Jennings, P. E. Laibinis (1996) Langmuir 12, 6173-6175; G. K. Jennings, P. E. Laibinis (1997) J. Am. Chem. Soc. 119, 5208-5214], for example, that self-assembled alkanethiol monolayers on UPD-deposited silver or copper on gold are more stable more stable against desorption at elevated temperatures than monolayers on gold alone, which may be due to a change binding of the sulfur headgroup from an $sp^3$-hybridization on Au to sp-hybridization on Au/Ag(UPD) and Au/Cu(UPD) [I-W. P. Chen, C.-C. Chen, S.-Y. Lin, C. Chen (2004) J. Phys. Chem. B 108, 17497-17504].

Besides enhancing stability of sulfur-bonded molecules to gold surfaces, the UPD process can promote the bonding of molecules with other kinds of CON connecting groups. For example, Lin et al. [S.-Y. Lin, C. Chen, Y.-C. Chan, C.-M. Lin, H.-W. Chen (2001) J. Phys. Chem. B 105, 4951-4955] demonstrated that UDP-deposited silver or copper on gold promotes the formation of SAMs of alkanecarboxylate compounds (compounds with the general formula RCOOH and salts thereof) and Baker et al. [M. V. Baker, G. K. Jennings, P. E. Laibinis (2000) Langmuir 16, 3288-3293] demonstrated that UPD-deposited copper on gold promotes the formation of SAMs of alkanephosphonate compounds (compounds with the general formula $RPO_3OH_2$ and salts thereof); both classes of compounds adsorb poorly to gold surfaces alone. Alkylphosphonate compounds are known to be easily prepared from the corresponding alkyl halides and phosphite esters the by the Arbuzov (or Michaelis-Arbuzov) rearrangement.

During the self-assembled deposition of the layer of molecule $M_B$ on the bottom electrode ($E_B$) and/or the deposition of the layer of molecule $M_T$ on the top electrode ($E_T$), it may be preferable or necessary to use aqueous instead of organic solutions. Such is the case, for example, when the device is fabricated using the PALO process, where the polymeric embedding layer for the top electrode may be damaged or destroyed if an organic solvent is used to deposit the layer of molecule $M_T$. However, in many cases, $M_T$ (or its precursors if $M_T$ is prepared in-situ) may be insoluble in water or insufficiently so. One way to overcome this problem is to use a mixed solvent system of water with one or more organic solvents, preferably water-miscible organic solvents such as ethanol, dimethylformamide, or tetrahydrofuran. However, depending on the nature of the polymeric embedding layer, there is still the risk of damaging it by using such mixed solvents, especially since the time required to deposit a closely-packed molecular layer can be hours or even days. A good alternative to using mixed solvents is to use aqueous micellar solutions. In a series of papers, Yan et al. [D. Yan, J. A. Saunders, G. K. Jennings (2000) Langmuir 16, 7562-7565; D. Yan, J. A. Saunders, G. K. Jennings (2002) Langmuir 18, 10202-10212; D. Yan, J. A. Saunders, G. K. Jennings (2003) Langmuir 19, 9290-9296] showed that aqueous micellar solutions of the nonionic surfactants hexaethylene glycol monododecyl ether ($C_{12}E_6$) or heptaethylene glycol monododecyl ether ($C_{12}E_7$) can be used to prepare self-assembled monolayers (SAMs) of alkanethiols on gold and that this process yields more densely packed layers with fewer defects than assembly from solutions of organic solvents. Other surfactants that are known to form micelles in water can be used instead of $C_{12}E_6$ or $C_{12}E_7$, including the general classes of nonionic, zwitterionic, anionic, and cationic amphiphilic detergents and block copolymers.

Rod-shaped molecules, especially ones with rigid or semi-rigid segments, may not yield compact SAMs with good ordering due to steric constraints. As already noted, such situations are undesirable because the likelihood of device failure is increased. One way to overcome this problem is to use mixed monolayers, that is, SAMs composed of functional molecules ($M_B$ or $M_T$) as well as electrically inert molecules that bind to the surface of the electrode in the voids or gaps between the functional molecules or at defect sites without displacing the functional molecules. Such mixed monolayers can be prepared either by coadsorption, whereby the substrate is treated with both types of molecules simultaneously, or by sequential adsorption, whereby a SAM of $M_B$ or $M_T$ is first prepared and subsequently treated with the second type of molecule. Typically, the electrically inert molecule is an alkanethiol $HSCH_2(CH_2)$—$CH_3$ (4<n<14) such as decanethiol (n=8). For example, dithiolate groups, such as dithiocarbamate, typically bind more strongly to gold than does the thiolate group, so that CON—ROD molecules with thiolate as CON generally will not displace CON—ROD molecules with dithiolate as CON from the gold surface. Therefore, SAMs based on dithiolate CON—ROD functional molecules can be treated with solutions of simple alkanethiolate molecules so that the latter occupy (block) the defect sites without interfering with the electrical properties of the SAMs.

In some cases, a functional group on the ROD segment of CON—ROD may be chemically reactive with the CON segment or it may compete with the CON segment for binding to the electrode surface. In such cases, it may be possible to introduce the functional group by chemical modification after forming the SAM, i.e. by modifying the ROD segment after the SAM of CON—ROD has been assembled on the substrate. Due to steric constraints within the SAM, such modifications will usually be restricted to the end of the ROD segment, i.e. to the surface of the SAM. Various strategies for covalently modifying the surfaces of SAMs using conventional organic chemical reactions were reviewed by Love et al. [J. C. Love, L. A. Estroff, J. K. Kriebel, R. G. Nuzzo, G. M. Whitesides (2005) Chem. Rev. 105, 1103-1170]. Many of these reactions are also used to couple biomolecules to surfaces [G. T. Hermanson (1996) Bioconjugate Techniques (Academic Press, San Diego)]. Such reactions include: condensation reactions (e.g. imines from aldehydes or ketones and amines; hydrazones from aldehydes or ketones and hydrazines or hydrazides; oximes from aldehydes or ketones and oxyamines; esters from carboxylic acids and alcohols; amides from carboxylic acids and amines; etc.), addition reactions (e.g. urethanes from isocyanates and alcohols; ureas from isocyanates and amines; thioureas from isothiocyanates and amines; triazoles from azides and alkynes (catalyzed by Cu(I)); etc.), alkylation reactions (e.g. secondary, tertiary or quaternary amines from primary amines and alkyl halides; alkyl ethers from phenols and alkyl halides; etc.), and removal or placement of protection groups. For example, the benzoquinone group is attractive as a strongly electron-accepting π-group, but it can react with thiolate or dithiolate groups by addition to one of the C=C double bonds. Therefore, it may not be possible to prepare SAMs directly from CON—ROD compounds with the general structure such as CON-σ-$π_A$, where the CON segment is a thiolate or dithiolate group and the conjugated group with electron acceptor character, $π_A$, is a benzoquinone group due to the possible chemical reaction between said groups. Instead, for example, in a first step a SAM could be prepared from the corresponding CON-σ compound with a carboxylic acid group attached to the σ-segment (CON-σ-COOH). Then, in a second step, the $π_A$-segment (benzoquinone) could be attached via, e.g., ester formation between the carboxylic acid group and an alcohol group on the $π_A$-segment (CON-σ-COOH+HO-$π_A$→CON-σ-COO-$π_A$+$H_2O$). Since the thus formed ester group linkage between the σ and $π_A$ segments is not conjugated with the latter, it would effectively act as an additional tunnel barrier in combination with the σ segment. The reaction just described would probably require activation of the carboxylic acid group in order for it to proceed to completion at a reasonable rate. Such activation methods are described in the prior art [G. T. Hermanson (1996) *Bioconjugate Techniques* (Academic Press, San Diego)].

Devices based on nonlinear optical (NLO) phenomena have been prepared from multilayered films containing non-centrosymmetric arrangements of highly polarizable chromophores. The orientation is crucial, because if the dipoles are not aligned in the film, there will be no second order NLO effects. Self-assembly has proven to be an effective process for constructing such films. The chromophores used as elements of NLO devices typically have electron donor-acceptor ("push-pull") character, and so are closely related to the donor-acceptor bilayer assemblies in the present invention, particularly those comprising functional molecules whose general structures contain $π_D$-σ-$π_A$ subunits. Various kinds of photonic or electro-optical devices are based on second-order NLO phenomena. Applications for these systems include second harmonic generation (SHG), optical information processing, communications and data processing, waveguides, modulators, and photorefractive materials.

BRIEF DESCRIPTION OF THE DRAWINGS

In the following, reference is made to the figures, wherein.

Figure 1:
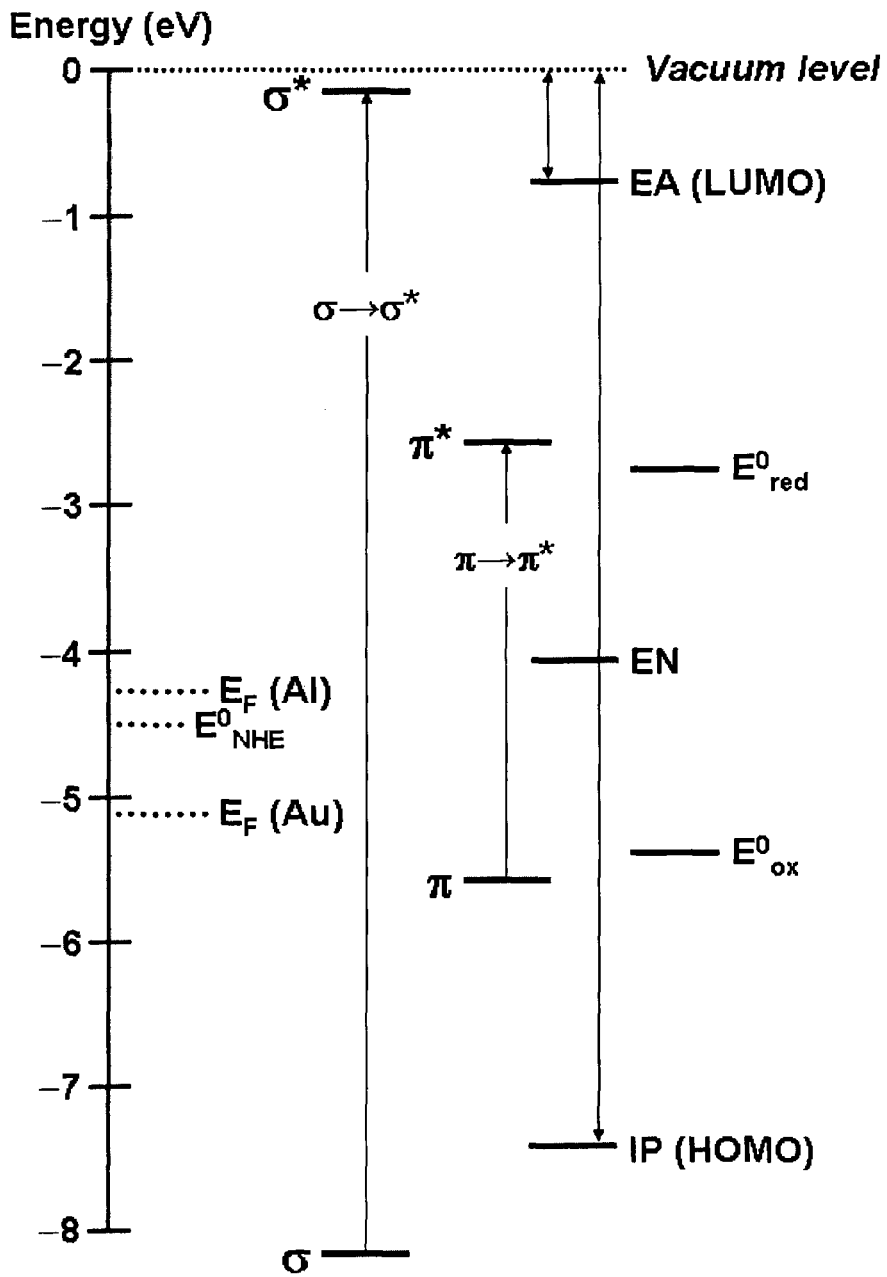
FIG. 1 is an orbital energy level diagram for anthracene as representative of a conjugated (π) group (subunit)
Figure 2:
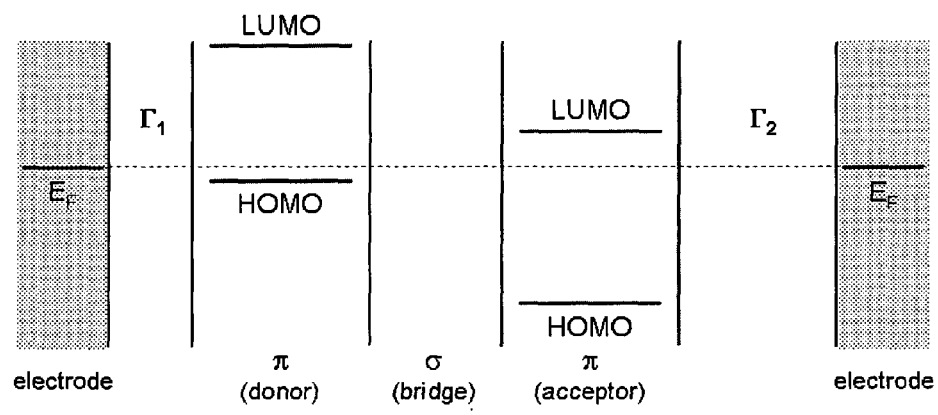
FIG. 2 is a diagram depicting the Aviram-Ratner concept for molecular rectifiers.
Figure 3:
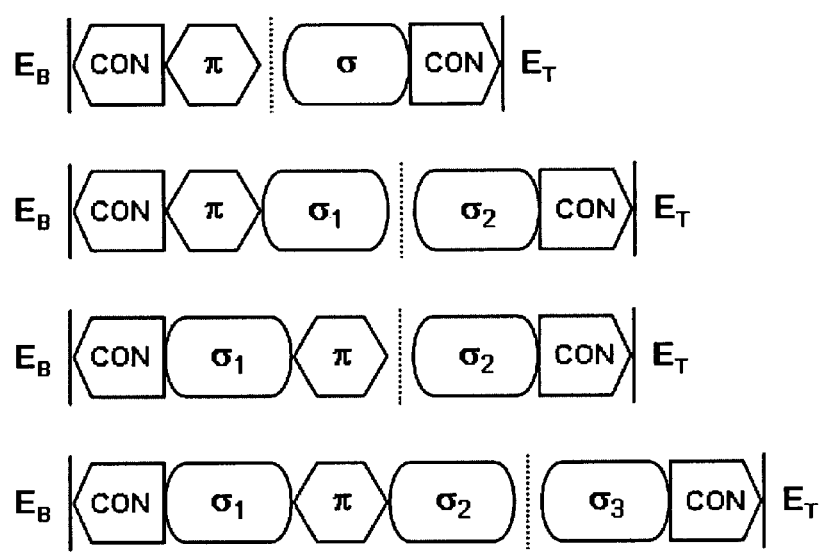
FIG. 3 is a summary of preferred combinations of monolayers of molecules $M_B$ and $M_T$ in junctions comprising sigma-pi-sigma type bilayers according to the present invention. $E_B$ and $E_T$ denote the bottom and top electrodes, respectively, while σ and π denote non-conjugated and conjugated groups, respectively. CON represents the group connecting the molecules to the respective electrodes. The dotted line represents a non-covalent interaction between the molecules comprising the two monolayers.
Figure 4:
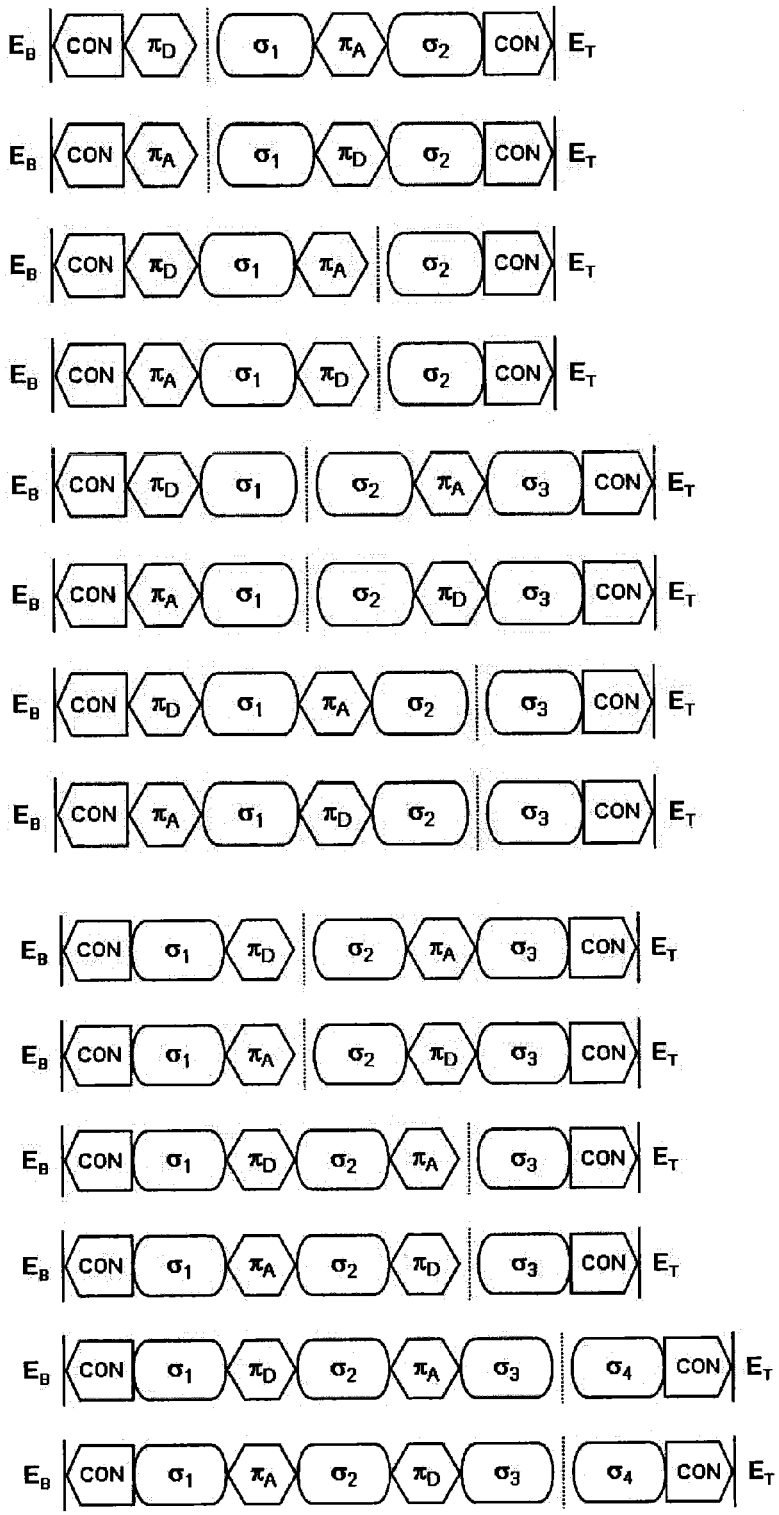
FIG. 4 is a summary of preferred combinations of monolayers of molecules $M_B$ and $M_T$ in junctions comprising donor-sigma-pi type bilayers according to the present invention. $E_B$ and $E_T$ denote the bottom and top electrodes, respectively, while σ and π denote non-conjugated and conjugated groups, respectively. The subscripts "D" and "A" denote π groups that are relatively electron-rich (electron donor) and relatively electron-poor (electron acceptor), respectively. CON represents the group connecting the molecules to the respective electrodes. The dotted line represents a non-covalent interaction between the molecules comprising the two monolayers.

Moreover, reference is made to the examples which are given to illustrate not to limit the present invention.

EXAMPLES

Example 1

SAMs Comprising Dithiocarbamate Compounds Prepared by the In-Situ Method Deposited on Electrodes ($E_T$-$M_T$ or $E_B$-$M_B$)

General procedure: To a solution of the amine (0.1-10 mM) in ethanol, one equivalent of $CS_2$ is added. Generally, at least one equivalent of base, typically either triethylamine or NaOH, is also added. If NaOH is used, it can be conveniently added as an aqueous solution if the amine and its dithiocarbamate salt are soluble enough in the mixed ethanol-water solvent. Other solvents can be used instead of ethanol, depending on the solubility properties of the amine and its dithiocarbamate salt. Alternative solvents are typically polar solvents such as methanol, dimethylformamide, or tetrahydrofuran. If the acid salt of the amine is used instead of the free-base form, an additional equivalent of base is added as a neutralizer. The substrate with electrodes is immersed into the above solution after all of the reagents have been added and kept there for 1-48 hours, typically for approximately 24 hours, after which it is rinsed with the pure solvent to remove any non-chemisorbed substances.

Table 2 provides the structure, classification, experimental conditions, and surface coverage based on X for SAMs on gold electrodes of four specific dithiocarbamate compounds obtained using the in-situ method. The values of surface coverage Tables 2-5 are relative to densely packed SAMs of alkanethiol compounds on gold, i.e. a surface coverage of 1.00 represents a value of 0.21 $nm^2$ for the area per molecule.

TABLE 2

SAMs on gold electrodes of dithiocarbamate compounds prepared by the in-situ method

| Structure of chemisorbed compound | Classification | Amine conc. | Base (conc.) | Time | Surface coverage |
|---|---|---|---|---|---|
| 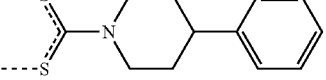 | CON-σ-π | 10 mM | NaOH (20 mM) | 23 hr | 1.02 |
| 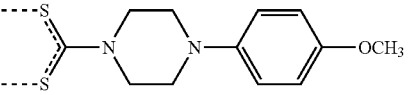 | CON-σ-$π_D$ | 1 mM | NaOH (2 mM) | 18 hr | 0.99 |
| 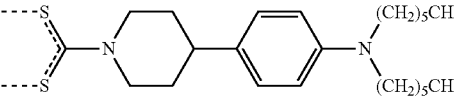 | CON-σ-$π_D$ | 1 mM | None | 18 hr | 0.87 |
| 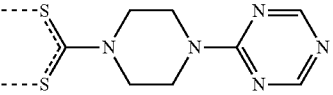 | CON-σ-$π_A$ | 0.1 mM | NaOH (0.1 MM) | 25 hr | 1.02 |

Example 2

SAMs Comprising Dithiocarbamate Compounds Prepared by the Ex-Situ Method Deposited on Electrodes ($E_T$-$M_T$ or $E_B$-$M_B$)

General procedure: The ex-situ method is similar to the in-situ method described above, the main difference being that the dithiocarbamate salt is isolated, typically as a crystalline solid, before it is used for SAM formation. Methods for synthesizing and purifying dithiocarbamate salts are well known in the prior art.

Table 3 provides the structure, classification, experimental conditions, and surface coverage based on X for SAMs on gold electrodes of two specific dithiocarbamate compounds obtained using the ex-situ method.

TABLE 3

SAMs on gold electrodes of dithiocarbamate compounds prepared by the ex-situ method

| Structure of chemisorbed compound | Classification | Amine conc. | Base (conc.) | Time | Surface coverage |
|---|---|---|---|---|---|
| 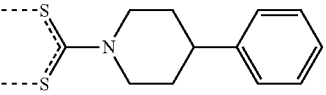 | CON-σ-πc | 10 mM | NaOH (10 mM) | 21 hr | 0.95 |
| 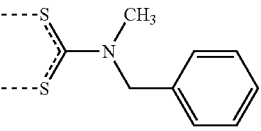 | CON-σ-π | 0.1 mM | None | 19 hr | 1.00 |

Example 3

SAMs Prepared by the Micelle-Assisted Method Deposited on Electrodes ($E_T$-$M_T$ or $E_B$-$M_B$)

General procedure: A solution containing both the SAM-forming compound (thiol or dithiocarbamate) and the detergent (hexaethylene glycol monododecyl ether, $C_{12}E_6$) in ethanol is diluted with water to provide the micellar assembly solution into which the substrate with electrodes is immersed. Alternatively, a solution of the SAM-forming compound in ethanol is diluted with an aqueous solution of the detergent. In either case, it is necessary that the concentration of the detergent after dilution exceeds the critical micelle concentration (CMC), which for $C_{12}E_6$ is approximately 1 µM. It is also necessary that the concentration of ethanol after dilution does not exceed approximately 5% of the total volume of the solution, so that micelle formation is possible. Other water-miscible organic solvents (e.g., methanol, isopropanol, dimethylacetamide, acetone, tetrahydrofuran, etc.) can be used instead of ethanol. The role of the water-miscible solvent is to facilitate incorporation of the SAM-forming compound into the micelle. It is not necessary to use such a solvent, but dissolution of the compound by the aqueous micellar solution may be slower or incomplete. If the SAM-forming compound is a dithiocarbamate salt, a base such as NaOH may be added to the micellar assembly solution to inhibit decomposition of the salt. The substrate with electrodes is immersed into the above solution after all of the reagents have been added and kept there for 1-48 hours, typically for approximately 24 hours, after which it is rinsed with pure water to remove any non-chemisorbed substances.

Table 4 provides the structure, classification, experimental conditions, and surface coverage based on X for SAMs on gold electrodes of a thiol compound and a dithiocarbamate compound obtained using the micelle-assisted method.

TABLE 4

SAMs on gold electrodes prepared by the micelle-assisted method

| Structure of chemisorbed compound | Classification | Conc. | Base (conc.) | Time | Surface coverage |
|---|---|---|---|---|---|
| ---S~~~~~~~CH₃ | CON-σ | 1 mM | None | 22 hr | 1.05 |
| ---S, ---S, C-N(CH₃)-CH₂-C₆H₅ | CON-σ-π | 0.1 mM | NaOH (0.1 mM) | 19 hr | 1.28 |

Example 4

SAMs Prepared by the Vapor Phase Method Deposited on Electrodes ($E_T$-$M_T$ or $E_B$-$M_B$)

General procedure: The substrate with electrodes is placed in a container together with the SAM-forming compound, and the container is sealed for a period of time, typically for 0.1-10 hours, to deposit the SAM. Depending on the volatility of the compound, it may be helpful to reduce the pressure inside the container by applying a vacuum and/or increasing the temperature. Following SAM deposition, the substrate with electrodes may be rinsed with a solvent such as ethanol to remove any non-chemisorbed substances.

Table 5 provides the structure, classification, experimental conditions, and surface coverage based on X for a SAM on gold electrodes of a thiol compound obtained using the vapor phase method.

TABLE 5

SAM on gold electrodes prepared by the vapor phase method

| Structure of chemisorbed compound | Classification | Conc. | Temperature (K) | Time | Surface coverage |
|---|---|---|---|---|---|
| ---S~~~~~~~CH₃ | CON-σ | NA | 295 | 0.5 | 1.00 |

Example 5

Junctions Comprising Molecular Bilayers in Crossed Electrodes Having the Structure $E_T$-$M_T$( )$M_B$-$E_B$ General procedure: Top electrodes ($E_T$) comprising parallel bars of gold (60 nm thick) on a silicon substrate with poly(acrylic acid) (neutralized with sodium hydroxide; ~200 nm thick) as water-soluble sacrificial layer and poly(methyl methacrylate) (~300 nm thick) as reinforcing layer, are prepared as described by Liissem et al. (manuscript submitted). A film of poly(dimethylsiloxane) (~1 mm thick) PMMA surface is brought into conformal contact with the poly(methyl methacrylate) surface for mechanical reinforcement before the electrodes are released in a water bath. The released top electrodes are cleaned with an argon plasma before depositing a SAM of molecule $M_T$, providing the top half of the junction having the structure $E_T$-$M_T$. Bottom electrode ($E_B$) comprising parallel bars of gold (50 nm thick) on a silicon substrate with chromium (5 nm thick) as adhesion layer, are treated with acetone and isopropanol to remove residual photoresist and then cleaned with an argon plasma before depositing a SAM of molecule $M_B$, providing the bottom half of the junction having the structure $E_B$-$M_B$. The two halves are then oriented so that the electrodes on each half are crossed and pressed together using a Fine-Placer to provide the structure $E_T$-$M_T$( )$M_B$-$E_B$. The electrical properties of the molecular bilayers in the junctions are measured with a source-measure unit.

Figure 5:
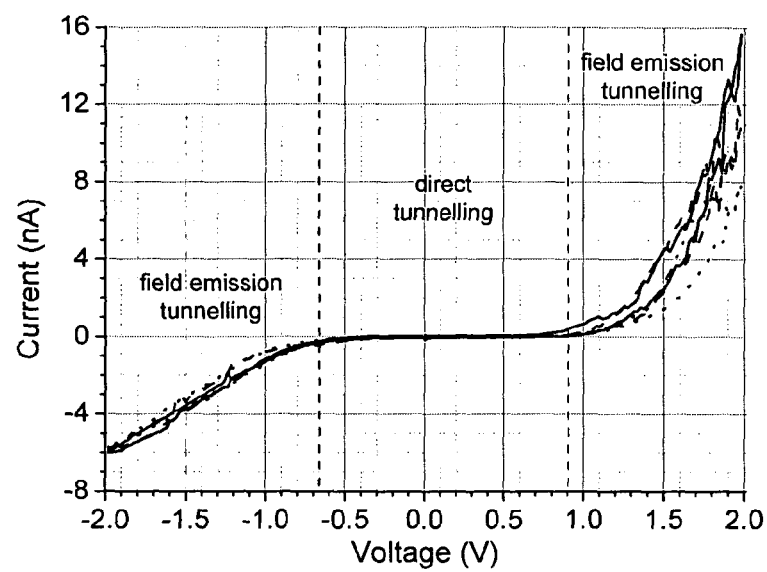
FIG. 5 shows the current-voltage behavior of three junctions having the structure $E_T$-$M_T$( )$M_B$-$E_B$ wherein $E_T$ and $E_B$ are gold electrodes, $M_T$ is hexadecanethiol, deposited by the solution phase method, and $M_B$ is dodecanethiol, deposited by the vapor phase method.

FIG. 5 shows the current-voltage behavior of junctions having the structure $E_T$-$M_T$( )$M_B$-$E_B$ wherein $E_T$ and $E_B$ are gold electrodes, $M_T$ is hexadecanethiol, deposited by the solution phase method, and $M_B$ is dodecanethiol, deposited by the vapor phase method. The data shown are for three junctions in a 16×16 crossed wire array, with the top and bottom electrode bar widths being 10 μm and 2 μm, respectively. When interpreted according to the Simmons approximation, the curves in FIG. 1 show that a transition from a direct tunnelling regime (at low bias) to a field emission tunnelling regime (at high bias) occurs at an applied voltage of ~0.8 V. The slope obtained in the direct tunnelling regime corresponds to a conductance within each junction of $\sigma \approx 4 \times 10^{-11}$ $\Omega^{-1}$. Since the area per alkanethiol molecule in SAMs on gold surfaces is ~0.21 nm², the number of thiol molecules on each electrode in the junction (area ≈20 μm²) is ~$10^8$. Therefore, the conductance within each junction corresponds to a conductance of $\sigma \approx 4 \times 10^{-19}$ $\Omega^{-1}$ per Au—S$C_{12}H_{25}$( )$C_{16}H_{33}$S—Au bimolecular pair, which is in accord with theory. While neither of the molecules used in this example contains a conjugated (π) system, so that the assembled junctions lack electronic functionality other than providing a tunnelling barrier, it demonstrates that suitable technology is available for assembling electrically functional junctions comprising asymmetric molecular bilayers sandwiched between two stationary solid state electrodes.

Example 6

HOMO and LUMO Energy Levels of Molecules Relative to the Fermi Level of the Electrode For the design of rectifying junctions based on combinations of electron donor and acceptor molecules in bilayer arrangements in junctions, potential compounds are studied by DFT ab-initio calculations. Depending on structural features such as the type of substituent(s) on conjugated ($\pi$) parts of the molecules, different positions of the molecular HOMO and LUMO levels relative to the Fermi level(s) of the electrodes can be achieved. This means that by appropriate bandgap engineering, i.e. through the combination of selected chemical species, junctions having rectifying characteristics can be realized.

Figure 6:
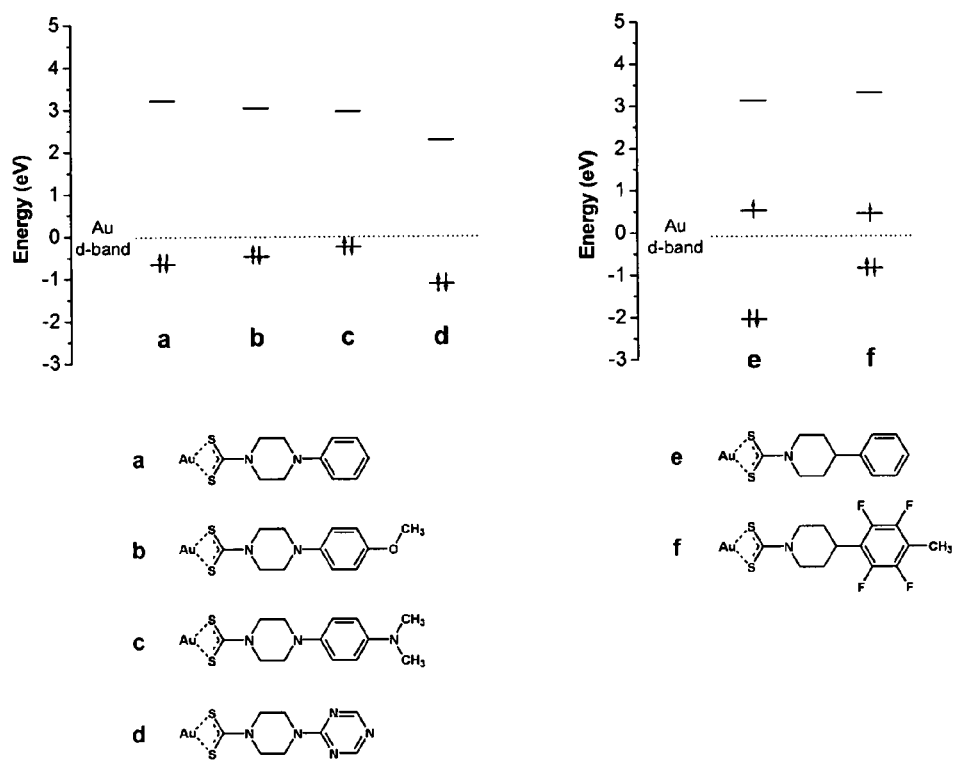
FIG. 6 shows calculated HOMO and LUMO levels of six dithiocarbamate compounds, which are either piperazine (a-d) or piperidine (e and f) derivatives.

FIG. 6 shows calculated HOMO and LUMO levels of six dithiocarbamate compounds, which are either piperazine (a-d) or piperidine (e and f) derivatives. The double arrows indicate doubly occupied electronic HOMO states, while the single arrows denote singly occupied HOMO states. The lines without arrows represent the lowest LUMO states. The dashed line, used as an energy reference representing the Fermi energy, corresponds to the highest occupied state localized on the Au atom comprising the electrode in the junction. For these particular compounds, a combination of c and d or of d and e could possibly drive the formation of a zwitterionic pair, and in any case would cause an asymmetry concerning the alignment of the HOMO and LUMO levels with the Fermi level at the two electrodes, thereby providing junctions having rectifying characteristics.

The invention claimed is:

1. A junction comprising a bilayer of two different functional molecules $M_B$ and $M_T$, sandwiched between a bottom electrode ($E_B$) and a top electrode ($E_T$), wherein
   at least one of said functional molecules $M_B$ and $M_T$ contains a conjugated ($\pi$) system;
   said electrodes $E_B$ and $E_T$ are solid state electrodes and stationary with respect to each other; and
   said junction is formed by depositing a self-assembled monolayer of said functional molecule $M_B$ on said electrode $E_B$, depositing a self-assembled monolayer of said functional molecule $M_T$ on said electrode $E_T$, and bringing said two self-assembled monolayers in contact with each other;
   wherein said self-assembled monolayer of said functional molecule $M_B$ is chemically bound to said electrode $E_B$, and said self-assembled monolayer of said functional molecule $M_T$ is chemically bound to said electrode $E_T$, and
   wherein said two self-assembled monolayers contact each other at their interface through non-covalent interactions.

2. Junction according to claim 1, wherein said junction is a crossbar junction.

3. Junction according to claim 1, wherein said bottom electrode and said top electrode are made of a material, for each electrode being independently a metal or a semiconductor, said metal comprising a transition metal, Mg, Ca, Zn, Cd, Al, Ga, In, or Sn or an alloy of said metal, and said semiconductor comprising C, Si, Ge, or a compound of a transition metal comprising Zn, Cd, Al, Ga, In, or Sn, with an element from the periodic table groups 15 (N-family) and 16 (O-family).

4. Junction according to claim 1, wherein the material for said bottom electrode and the material for said top electrode are the same or different.

5. Junction according to claim 1, wherein said first functional molecule ($M_B$) and said second functional molecule ($M_T$) have the general structure:
   CON—ROD,
   wherein the segment denoted CON— is a connecting group bound to said bottom electrode ($E_B$) or said top electrode ($E_T$), and
   the segment denoted —ROD comprises a non-conjugated ($\sigma$) group, a conjugated ($\pi$) group, or a combination of one or more non-conjugated group(s) ($\sigma$) and one or more conjugated group(s) ($\pi$).

6. Junction according to claim 5, wherein said connecting group CON— of CON—ROD comprises $S_2$CNH— or $S_2$CNR— (dithiocarbamate, −1 charge), S— (thiolate, −1 charge), Se— (selenate, −1 charge), Te— (tellurate, −1 charge), S(SR)— (disulfide, 0 charge), $S_2$C— (dithiocarboxylate, −1 charge), $S_2$C=C(CN)— (ethylenedithiolate, −2 charge); $S_2$C=C(CN)C(O)O— (ethylenedithiolate, −2 charge); $S_2$C=C[C(O)—]$_2$ (ethylenedithiolate, −2 charge), $S_2C_2R$— (1,2-dithiolate, −2 charge), $S_2$CO— (xanthate, −1 charge), $S_3$P— (trithiophosphonate, −2 charge), $S_2$PR— (phosphinodithioate, −1 charge), $S_2$P(OR)— or $S_2$P(R)O— (phosphonodithioate, −1 charge), $S_2$P(OR)O— (phosphorodithioate, −1 charge), SOC— (thiocarboxylate, −1 charge), SC(NH$_2$)NH— or SC(NHR)NH— (thiourea, 0 charge), SC$_4$H$_3$— (thiophene, 0 charge), S(R)— (thioether, 0 charge), CN— (isonitrile, 0 charge), NC$_5$H$_4$— (pyridine, 0 charge), P(R)(R')— (phosphine, 0 charge), O$_2$C— (carboxylate, −1 charge), O$_2$P(O)— (phosphonate, −2 charge), O$_2$P(O)O— (phosphate, −2 charge), OS(O)$_2$— (sulfonate, −1 charge), OS(O)$_2$O— (sulfate, −1 charge), wherein R and R' denote alkyl, aryl, or alkaryl substituents.

7. Junction according to claim 5, wherein said non-conjugated group(s) ($\sigma$) of the segment —ROD of CON—ROD are selected from the group of straight alkane chains, cyclic or polycyclic aliphatic carbon skeletons, having the general structure:

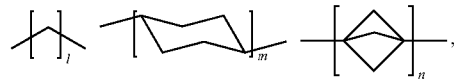

wherein "l" is selected from integers between and including 1 to 18, "m" is selected from integers 1 and 2, and "n" is selected from integers between and including 1 to 3, and further derivatives thereof, wherein one or more of the CH$_2$ groups is substituted by NH, O, or S.

8. Junction according to claim 7, wherein "l" is selected from integers between and including 1 to 8.

9. Junction according to claim 5, wherein the combined length of said non-conjugated group(s) ($\sigma$) of the segment —ROD of CON—ROD is less than 3 nm.

10. Junction according to claim 5, wherein said functional molecule (CON—ROD) has the general structure
   CON-$\sigma$,
   CON-$\pi$,
   CON-$\pi_D$,
   CON-$\pi_A$,
   CON-$\sigma$-$\pi$,
   CON-$\sigma$-$\pi_D$,
   CON-$\sigma$-$\pi_A$,
   CON-$\pi$-$\sigma$,
   CON-$\pi_D$-$\sigma$,
   CON-$\pi_A$-$\sigma$,
   CON-$\sigma$-$\pi$-$\sigma$, CON-σ-$\pi_D$-σ,
CON-σ-$\pi_A$-σ,
CON-$\pi_D$-σ-$\pi_A$,
CON-$\pi_A$-σ-$\pi_D$,
CON-σ-π-σ-$\pi_A$,
CON-σ-$\pi_D$-σ-$\pi_A$,
CON-σ-$\pi_A$-σ-$\pi_D$,
CON-$\pi_D$-σ-$\pi_A$-σ,
CON-$\pi_A$-σ-$\pi_D$-σ,
CON-σ-π-σ-$\pi_A$-σ,
CON-σ-$\pi_D$-σ-$\pi_A$-σ, or
CON-σ-$\pi_A$-σ-$\pi_D$-σ,
wherein σ denotes a non-conjugated group, π denotes a conjugated group, $\pi_A$ denotes a conjugated group with electron acceptor character, and $\pi_D$ denotes a group with electron donor character.

11. Junction according to claim 5, wherein said non-conjugated groups (σ) comprise aliphatic or alicyclic systems or heteroatom substituted derivatives thereof, and wherein said conjugated groups (π) comprise aromatic, heterocyclic, or organometallic systems.

12. Junction according to claim 1, wherein combinations of said functional molecules $M_B$ and $M_T$ forming said molecular bilayer comprise
CON-π and CON-σ,
CON-π-σ and CON-σ,
CON-σ-π and CON-σ,
CON-σ-π-σ and CON-σ,
CON-$\pi_D$ and CON-σ-$\pi_A$-σ,
CON-$\pi_A$ and CON-σ-$\pi_D$-σ,
CON-$\pi_D$-σ-$\pi_A$ and CON-σ,
CON-$\pi_A$-σ-$\pi_D$ and CON-σ,
CON-$\pi_D$-σ and CON-σ-$\pi_A$-σ,
CON-$\pi_A$-σ and CON-σ-$\pi_D$-σ,
CON-$\pi_D$-σ-$\pi_A$-σ and CON-σ,
CON-$\pi_A$-σ-$\pi_D$-σ and CON-σ,
CON-σ-$\pi_D$ and CON-σ-$\pi_A$-σ,
CON-σ-$\pi_A$ and CON-σ-$\pi_D$-σ,
CON-σ-$\pi_D$-σ-$\pi_A$ and CON-σ,
CON-σ-$\pi_A$-σ-$\pi_D$ and CON-σ,
CON-σ-$\pi_D$-σ-$\pi_A$-σ and CON-σ, or
CON-σ-$\pi_A$-σ-$\pi_D$-σ and CON-σ.

13. An electronic device, a photonic device, or an electro-optical device comprising a junction according to claim 1.

14. Junction according to claim 1, obtained by using a non-invasive deposition technique.

15. Junction according to claim 14, wherein the non-invasive deposition technique comprises lift-off float-on (LOFO), nanotransfer printing (nTP), polymer-assisted lift-off (PALO) or shuttle-transfer printing (STP).

16. A method comprising producing the junction of claim 14 using a non-invasive deposition technique.

17. The method of producing the junction according to claim 16, wherein the non-invasive deposition technique comprises lift-off float-on (LOFO), nanotransfer printing (nTP), polymer-assisted lift-off (PALO) or shuttle-transfer printing (STP).

* * * * *